US009812491B2

(12) United States Patent
Tamaki et al.

(10) Patent No.: US 9,812,491 B2
(45) Date of Patent: Nov. 7, 2017

(54) IMAGING DEVICE

(71) Applicant: Panasonic Intellectual Property Management Co., Ltd., Osaka (JP)

(72) Inventors: Tokuhiko Tamaki, Osaka (JP); Takeyoshi Tokuhara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/441,308

(22) Filed: Feb. 24, 2017

(65) Prior Publication Data
US 2017/0263669 A1   Sep. 14, 2017

(30) Foreign Application Priority Data

Mar. 10, 2016   (JP) ................. 2016-047452

(51) Int. Cl.
| H01L 31/113 | (2006.01) |
| H01L 27/146 | (2006.01) |
| H04N 5/355  | (2011.01) |
| H04N 5/369  | (2011.01) |

(52) U.S. Cl.
CPC .. *H01L 27/14665* (2013.01); *H01L 27/14614* (2013.01); *H01L 27/14627* (2013.01); *H01L 27/14636* (2013.01); *H04N 5/355* (2013.01); *H04N 5/3698* (2013.01)

(58) Field of Classification Search
None
See application file for complete search history.

(56) References Cited

U.S. PATENT DOCUMENTS

| 7,965,329 | B2 * | 6/2011 | McCarten | ......... H01L 27/14634 348/308 |
| 2005/0225655 | A1 | 10/2005 | Suzuki | |
| 2011/0049591 | A1 * | 3/2011 | Nakatani | ............... H01L 27/307 257/292 |
| 2013/0264611 | A1 * | 10/2013 | Rothberg | ............. C12Q 1/6874 257/253 |

FOREIGN PATENT DOCUMENTS

| JP | 2004-134593 | 4/2004 |
| JP | 2005-286104 | 10/2005 |
| JP | 2011-060830 | 3/2011 |
| JP | 2011-071481 | 4/2011 |

\* cited by examiner

*Primary Examiner* — Ali Naraghi
(74) *Attorney, Agent, or Firm* — McDermott Will & Emery LLP

(57) ABSTRACT

An imaging device including: pixel cells each comprising: a photoelectric converter including two electrodes and a photoelectric conversion layer therebetween; a field effect transistor having a gate and a channel region; and a node between the photoelectric converter and the field effect transistor. The field effect transistor outputs an electric signal corresponding to change in dielectric constant between the electrodes, the change being caused by incident light on the photoelectric conversion layer. Cpd1, Cn1, Cpd2 and Cn2 satisfy a relation of Cpd1/Cn1<Cpd2/Cn2 where a capacitance value of a first photoelectric converter in a state of receiving no incident light is Cpd1, a capacitance value between a first node and a first channel region is Cn1, a capacitance value of a second photoelectric converter in a state of receiving no incident light is Cpd2, and a capacitance value between a second node and a second channel region is Cn2.

14 Claims, 12 Drawing Sheets

IMAGING DEVICE

BACKGROUND

1. Technical Field

The present disclosure relates to an imaging device.

2. Description of the Related Art

An optical detection element has so far been used in an optical detector, an image sensor, etc. A typical example of the optical detection element is a photoelectric converter, such as a photodiode or a phototransistor. As well known, light can be detected by detecting a photocurrent that is generated in the photoelectric converter with irradiation of the light.

Japanese Unexamined Patent Application Publication No. 2011-60830 discloses, in FIG. 2, a thin film transistor (TFT) including, as a gate insulating film, an organic film in which a predetermined compound is dispersed in an organic polymer. A compound whose polarized state is changed with irradiation of light is selected as the predetermined compound constituting the organic film. In the thin film transistor disclosed in Japanese Unexamined Patent Application Publication No. 2011-60830, the dielectric constant of the gate insulating film is changed with irradiation of light to the gate insulating film. Accordingly, a current flowing between a source and a drain is changed with the irradiation of the light to the gate insulating film. Japanese Unexamined Patent Application Publication No. 2011-60830 sets forth that the above-mentioned type of thin film transistor can be used as a photosensor.

SUMMARY

In the field of an image sensor, there is a demand for further widening of a dynamic range.

One non-limiting and exemplary embodiment provides an imaging device including: a first pixel cell comprising: a first photoelectric converter including a first electrode, a second electrode facing the first electrode, and a first photoelectric conversion layer between the first electrode and the second electrode; a first field effect transistor having a first gate and a first channel region, the first gate being connected to the first electrode; and a first node between the first photoelectric converter and the first field effect transistor, and a second pixel cell comprising: a second photoelectric converter including a third electrode, a fourth electrode facing the third electrode, and a second photoelectric conversion layer between the third electrode and the fourth electrode; a second field effect transistor having a second gate and a second channel region, the second gate being connected to the third electrode, and a second node between the first photoelectric converter and the second field effect transistor. The first field effect transistor outputs a first electric signal corresponding to change in dielectric constant between the first electrode and the second electrode, the change being caused by incident light on the first photoelectric conversion layer. The second field effect transistor outputs a second electric signal corresponding to change in dielectric constant between the third electrode and the fourth electrode, the change being caused by incident light on the second photoelectric conversion layer. $Cpd1$, $Cn1$, $Cpd2$ and $Cn2$ satisfy a relation of $Cpd1/Cn1 < Cpd2/Cn2$ where a value of capacitance of the first photoelectric converter in a state of receiving no incident light is represented as $Cpd1$, a value of capacitance between the first node and the first channel region is represented as $Cn1$, a value of capacitance of the second photoelectric converter in a state of receiving no incident light is represented as $Cpd2$, and a value of capacitance between the second node and the second channel region is represented as $Cn2$.

It should be noted that general or specific embodiments may be implemented as an element, a device, a system, an integrated circuit, or a method. Furthermore, general or specific embodiments may be implemented as any selective combination of an element, a device, a system, an integrated circuit, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
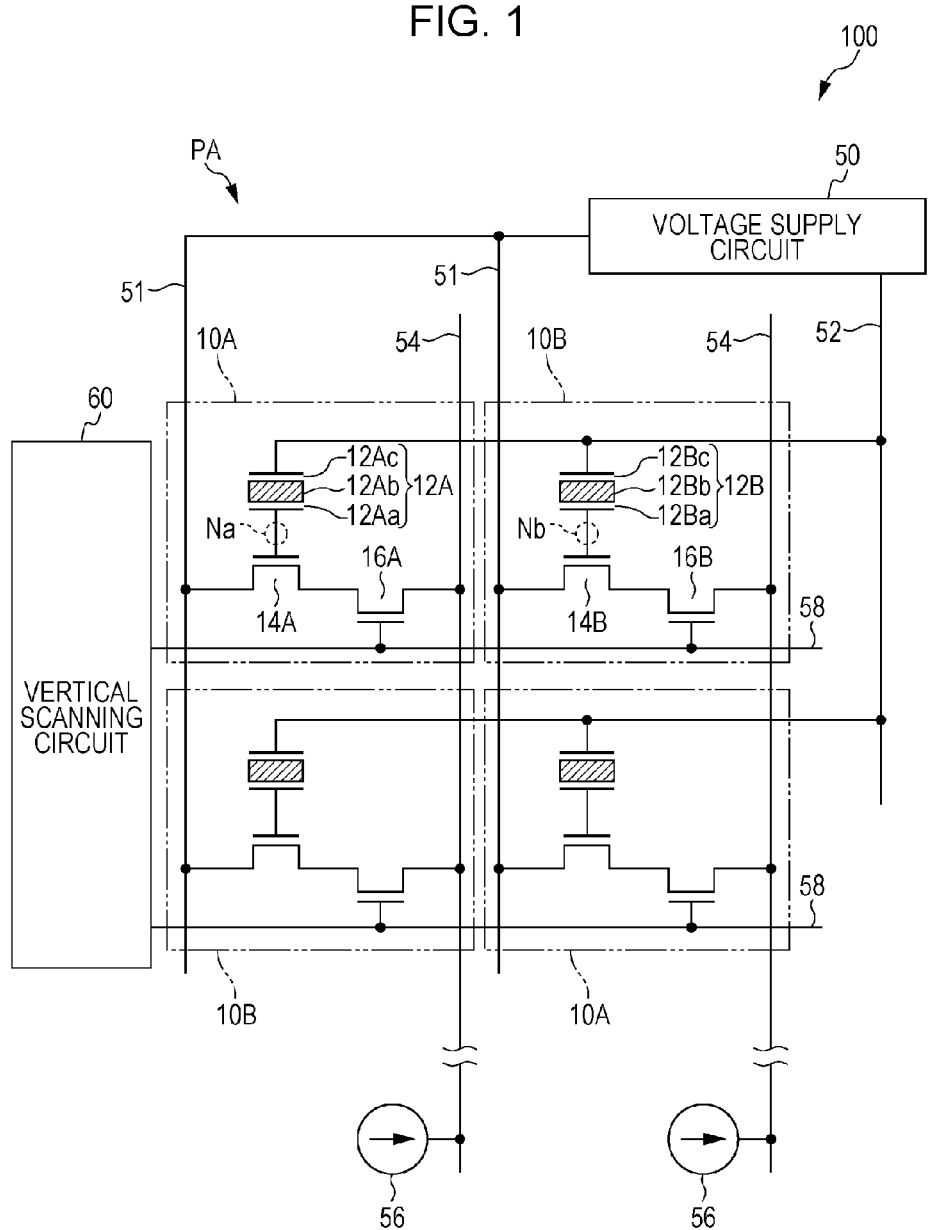
FIG. 1 is a schematic view illustrating an exemplary circuit configuration of an imaging device according to an embodiment of the present disclosure.

One embodiment of the present disclosure is summarized as follows.

[Item 1]
An imaging device comprising:
a first pixel cell comprising:
a first photoelectric converter including a first electrode, a second electrode facing the first electrode, and a first photoelectric conversion layer between the first electrode and the second electrode;
a first field effect transistor having a first gate and a first channel region, the first gate being connected to the first electrode; and
a first node between the first photoelectric converter and the first field effect transistor, and
a second pixel cell comprising:
a second photoelectric converter including a third electrode, a fourth electrode facing the third electrode, and a second photoelectric conversion layer between the third electrode and the fourth electrode;
a second field effect transistor having a second gate and a second channel region, the second gate being connected to the third electrode, and a second node between the first photoelectric converter and the second field effect transistor, wherein
the first field effect transistor outputs a first electric signal corresponding to change in dielectric constant between the first electrode and the second electrode, the change being caused by incident light on the first photoelectric conversion layer,
the second field effect transistor outputs a second electric signal corresponding to change in dielectric constant between the third electrode and the fourth electrode, the change being caused by incident light on the second photoelectric conversion layer, and
$Cpd1$, $Cn1$, $Cpd2$ and $Cn2$ satisfy a relation of $Cpd1/Cn1 < Cpd2/Cn2$ where a value of capacitance of the first photoelectric converter in a state of receiving no incident light is represented as $Cpd1$, a value of capacitance between the first node and the first channel region is represented as $Cn1$, a value of capacitance of the second photoelectric converter in a state of receiving no incident light is represented as $Cpd2$, and a value of capacitance between the second node and the second channel region is represented as $Cn2$.

[Item 2]
The imaging device according to Item 1, wherein the first photoelectric conversion layer and the second photoelectric conversion layer are a single continuous layer.

[Item 3]
The imaging device according to Item 1 or 2, wherein the second electrode and the fourth electrode are a single continuous electrode.

[Item 4]
The imaging device according to any one of Items 1 to 3, comprising a plurality of pixel cells including the first pixel cell and the second pixel cell, wherein the plurality of pixel cells are arranged one-dimensionally or two-dimensionally.

[Item 5]
The imaging device according to any one of Items 1 to 4, wherein the first pixel cell is directly adjacent to the second pixel cell.

[Item 6]
The imaging device according to any one of Items 1 to 5, wherein
the capacitance between the first node and the first channel region includes a capacitance of a first gate insulating layer of the first field effect transistor, and
the capacitance between the second node and the second channel region includes a capacitance of a second gate insulating layer of the second field effect transistor.

[Item 7]
The imaging device according to any one of Items 1 to 6, wherein
each of the first photoelectric conversion layer and the second photoelectric conversion layer has a photocurrent characteristic between a bias voltage and an output current density, the photocurrent characteristic including a first voltage range where an absolute value of the output current density increases as the bias voltage increases in a reverse direction, a second voltage range where the output current density increases as the bias voltage increases in a forward direction, and a third voltage range where an absolute value of a change rate of the output current density relative to the bias voltage is smaller than in the first voltage range and the second voltage range, the third voltage range being a voltage range between the first voltage range and the second voltage range.

[Item 8]
The imaging device according to Item 7, further comprising
a first voltage supply circuit that supplies a first bias voltage within the third voltage range to the first photoelectric conversion layer, and
a second voltage supply circuit that supplies a second bias voltage within the third voltage range to the second photoelectric conversion layer.

[Item 9]
The imaging device according to any one of Items 1 to 8, wherein, in a plan view, an area of the first electrode is smaller than an area of the third electrode.

[Item 10]
The imaging device according to any one of Items 1 to 9, wherein, in a plan view, an area of a gate insulating layer of the first field effect transistor is larger than an area of a gate insulating layer of the second field effect transistor.

[Item 11]
The imaging device according to any one of Items 1 to 10, wherein a thickness of a gate insulating layer of the first field effect transistor is smaller than a thickness of a gate insulating layer of the second field effect transistor.

[Item 12]
The imaging device according to any one of Items 1 to 11, wherein the first pixel cell includes a microlens located on the second electrode.

[Item 13]
An imaging device including a plurality of pixel cells, each of the plurality of pixel cells comprising:
a first photoelectric converter including a first electrode, a transparent second electrode, and a first photoelectric conversion layer disposed between the first electrode and the second electrode; and
a first field effect transistor having a gate electrode electrically connected to the first electrode,
wherein the first field effect transistor outputs an electric signal corresponding to change in dielectric constant between the first electrode and the second electrode, the change being caused by incidence of light upon the first photoelectric conversion layer through the second electrode, and
assuming that $Cpd1$ denotes a value of capacitance of the first photoelectric converter in a state where no light is incident on the first photoelectric converter, and $Cn1$ denotes a value of capacitance between a node, which is positioned between the first photoelectric converter and the first field effect transistor, and a channel region of the first field effect transistor, the plurality of pixel cells include at least one pixel cell that is different in ratio of Cpd1 to Cn1 from the other one or more pixel cells.

According to the features of Item 13, the pixel cells having different sensitivities can be arranged within a pixel array.

[Item 14]

An imaging device comprising:
one or more first pixel cells each including a first photoelectric converter and a first field effect transistor; and
one or more second pixel cells each including a second photoelectric converter and a second field effect transistor,
wherein the first photoelectric converter includes a first electrode, a transparent second electrode, and a first photoelectric conversion layer disposed between the first electrode and the second electrode,
a gate electrode of the first field effect transistor is electrically connected to the first electrode,
the second photoelectric converter includes a third electrode, a transparent fourth electrode, and a second photoelectric conversion layer disposed between the third electrode and the fourth electrode,
a gate electrode of the second field effect transistor is electrically connected to the third electrode,
the first field effect transistor outputs an electric signal corresponding to change in dielectric constant between the first electrode and the second electrode, the change being caused by incidence of light upon the first photoelectric conversion layer through the second electrode,
the second field effect transistor outputs an electric signal corresponding to change in dielectric constant between the third electrode and the fourth electrode, the change being caused by incidence of light upon the second photoelectric conversion layer through the fourth electrode, and
assuming that Cpd1 denotes a value of capacitance of the first photoelectric converter in a state where no light is incident on the first photoelectric converter, Cn1 denotes a value of capacitance between a node, which is positioned between the first photoelectric converter and the first field effect transistor, and a channel region of the first field effect transistor, Cpd2 denotes a value of capacitance of the second photoelectric converter in a state where no light is incident on the second photoelectric converter, and Cn2 denotes a value of capacitance between a node, which is positioned between the second photoelectric converter and the second field effect transistor, and a channel region of the second field effect transistor, a ratio of Cpd1 to Cn1 and a ratio of Cpd2 to Cn2 are different from each other.

According to the features of Item 14, sensitivity can be made different from each other between the first and second pixel cells.

[Item 15]

The imaging device according to Item 14, wherein the first photoelectric conversion layer and the second photoelectric conversion layer are in form of a continuous single layer.

According to the feature of Item 15, a manufacturing process can be avoided from becoming complicated.

[Item 16]

The imaging device according to Item 14 or 15, wherein the second electrode and the fourth electrode are in form of a continuous single electrode.

According to the feature of Item 16, a manufacturing process can be avoided from becoming complicated.

[Item 17]

The imaging device according to any one of Items 14 to 16, wherein the one or more first pixel cells are the plurality of first pixel cells,
the one or more second pixel cells are the plurality of second pixel cells, and
the plurality of first pixel cells and the plurality of second pixel cells are arrayed one-dimensionally or two-dimensionally.

According to the feature of Item 17, an image obtained with the pixel cells having relatively high sensitivity and an image obtained with the pixel cells having relatively low sensitivity can be obtained.

[Item 18]

The imaging device according to any one of Items 14 to 17, wherein at least one of the one or more first pixel cells is adjacent to at least one of the one or more second pixel cells.

[Item 19]

The imaging device according to any one of Items 14 to 18, wherein the capacitance between the node, which is positioned between the second photoelectric converter and the second field effect transistor, and the channel region of the second field effect transistor includes a capacitance of a gate insulating layer of the second field effect transistor.

According to the feature of Item 19, a sensitivity ratio between the first pixel cell and the second pixel cell can be adjusted by adjusting the capacitance of the gate insulating layer of the second field effect transistor.

[Item 20]

The imaging device according to any one of Items 14 to 19, wherein the second photoelectric conversion layer has photocurrent characteristics exhibiting different change rates of an output current density relative to a bias voltage among a first voltage range where an absolute value of the output current density increases as a bias voltage in a reverse direction increases, a second voltage range where the output current density increases as a bias voltage in a forward direction increases, and a third voltage range between the first voltage range and the second voltage range, and
the change rate exhibited by the second photoelectric conversion layer in the third voltage range is smaller than the change rate exhibited by the second photoelectric conversion layer in the first voltage range and the change rate exhibited by the second photoelectric conversion layer in the second voltage range.

[Item 21]

The imaging device according to any one of Items 13 to 20, wherein the capacitance between the node, which is positioned between the first photoelectric converter and the first field effect transistor, and the channel region of the first field effect transistor includes a capacitance of a gate insulating layer of the first field effect transistor.

According to the feature of Item 21, a sensitivity ratio in a set of the pixel cells having sensitivities different from each other can be adjusted by adjusting the capacitance of the gate insulating layer of the first field effect transistor.

[Item 22]

The imaging device according to any one of Items 13 to 21, wherein the first photoelectric conversion layer has photocurrent characteristics exhibiting different change rates of an output current density relative to a bias voltage among a first voltage range where an absolute value of the output current density increases as a bias voltage in a reverse direction increases, a second voltage range where the output current density increases as a bias voltage in a forward direction increases, and a third voltage range between the first voltage range and the second voltage range, and the change rate exhibited by the first photoelectric conversion layer in the third voltage range is smaller than the change rate exhibited by the first photoelectric conversion layer in the first voltage range and the change rate exhibited by the first photoelectric conversion layer in the second voltage range.

Embodiments of the present disclosure will be described in detail below with reference to the drawings. It is to be noted that any of the following embodiments represents a general or specific example. Thus, numerical values, shapes, materials, components, arrangements and connected forms of the components, steps, sequences of steps, and so on, which are described in the following embodiments, are merely illustrative, and they are not purported to limit the present disclosure. The individual embodiments described in this specification can be combined with each other insofar as not causing contradictions. Among the components in the following embodiments, those ones other than the components not stated in an independent claim, which defines the most significant concept, are components that can be optionally used. In the following description, the components having substantially the same functions are denoted by common reference sings and description of those components is omitted in some cases.

(Embodiment of Imaging device)

FIG. 1 illustrates an exemplary circuit configuration of an imaging device 100 according to an embodiment of the present disclosure. The imaging device 100 illustrated in FIG. 1 includes a pixel array PA containing a plurality of pixel cells. The pixel cells are arrayed one- or two-dimensionally to form an image pickup region (i.e., a photosensitive region). When the pixel cells are arrayed one-dimensionally, for example, the imaging device 100 can be utilized as a line sensor. Here, a two-dimensional array is illustrated as one exemplary array of the pixel cells in the pixel array PA. FIG. 1 illustrates four pixel cells extracted among the pixel cells, which are arrayed two-dimensionally, for the sake of avoiding complication of the drawing.

The pixel array PA includes one or more pixel cells 10A and one or more pixel cells 10B. In the example illustrated in FIG. 1, two pixel cells 10A and two pixel cells 10B are arrayed in a matrix pattern of two rows and two columns. In the illustrated example, the pixel cells 10A and the pixel cells 10B are alternately arranged in a row direction and a column direction. The row direction defined in this specification represents a direction in which a row extends. The column direction defined in this specification represents a direction in which a column extends. For example, a horizontal direction in a drawing sheet of FIG. 1 represents the row direction, and a vertical direction in the drawing sheet represents the column direction. A distance between two pixel cells adjacent to each other (i.e., a pixel pitch) may be about 2 μm, for example.

As a matter of course, the number and the layout of the pixel cells 10A and 10B in the imaging device 100 are not limited to those illustrated in the example of FIG. 1. For example, the pixel array PA may be a one- or two-dimensional array of a set of the pixel cell 10A and the pixel cell 10B. In other words, the set of the pixel cell 10A and the pixel cell 10B may be arrayed at a certain pitch in the row direction and/or the column direction. The number of the pixel cells 10A and the number of the pixel cells 10B both included in the pixel array PA are not always required to be the same.

As schematically illustrated in FIG. 1, the pixel cell 10A includes a photoelectric converter 12A and a signal detection transistor 14A. In the illustrated example, the pixel cell 10A further includes an address transistor 16A. As with the pixel cell 10A, the pixel cell 10B also includes a photoelectric converter 12B, a signal detection transistor 14B, and an address transistor 16B. Here, the signal detection transistors 14A and 14B are each a field effect transistor (FET).

Connection relations among individual components in the pixel cell 10B are basically similar to those among individual components in the pixel cell 10A. In addition, a basic structure of each of the components in the pixel cell 10B is typically in common to that of a corresponding component in the pixel cell 10A. Therefore, the connection relations among the individual components in the pixel cell 10A will be mainly described below. In the following, an N-channel MOS is employed as an example of the transistor. Thus, in the following description, the signal detection transistors 14A and 14B and the address transistors 16A and 16B are each an N-channel MOS unless otherwise specified.

In the configuration illustrated in FIG. 1, one of a source and a drain (typically, a source) of the signal detection transistor 14A is connected, through the address transistor 16A, to corresponding one of a plurality of output lines 54 that are disposed in a one-to-one relation to the columns of the pixel cells. A constant-current source 56 is connected to one end of each of the output lines 54.

The other of the source and the drain (i.e., the drain here) of the signal detection transistor 14A is connected to corresponding one of a plurality of first voltage lines 51 that are disposed in a one-to-one relation to the columns of the pixel cells. The first voltage lines 51 are connected to a voltage supply circuit 50. In the illustrated example, the voltage supply circuit 50 is further connected to second voltage lines 52. As schematically illustrated in FIG. 1, the second voltage lines 52 are connected to the photoelectric converters 12A of the individual pixel cells 10A and the photoelectric converters 12B of the individual pixel cells 10B.

During the operation of the imaging device 100, the voltage supply circuit 50 supplies, through the first voltage line 51, a predetermined voltage (first bias voltage) to the signal detection transistor 14A of each pixel cell 10A and the signal detection transistor 14B of each pixel cell 10B (i.e., to the drains of those pixel cells). During the operation of the imaging device 100, the voltage supply circuit 50 further supplies, through the second voltage line 52, a predetermined voltage (second bias voltage) to the photoelectric converter 12A of each pixel cell 10A and the photoelectric converter 12B of each pixel cell 10B. The voltage supply circuit 50 is not limited to a particular power supply circuit, and it may be any type of circuit generating the predetermined voltages, or any type of circuit transforming a voltage supplied from another power supply to the predetermined voltages. The voltage supply circuit 50 may include a first voltage supply circuit connected to the first voltage lines 51, and a second voltage supply circuit connected to the second voltage lines 52. At least one of a circuit for supplying the first bias voltage to the first voltage lines 51 and a circuit for supplying the second bias voltage to the second voltage lines 52 may be part of a vertical scanning circuit 60 described later.

As described in detail later with reference to the drawings, the photoelectric converter 12A includes a pixel electrode 12Aa, a transparent electrode 12Ac, and a photoelectric conversion layer 12Ab sandwiched between those two electrodes. As schematically illustrated in FIG. 1, the pixel electrode 12Aa of the photoelectric converter 12A is electrically connected to a gate of the signal detection transistor 14A. The second voltage line 52 is connected to the transparent electrode 12Ac of the photoelectric converter 12A.

As described above, during the operation of the imaging device 100, the voltage supply circuit 50 supplies the first bias voltage to the first voltage line 51 and the second bias voltage to the second voltage line 52. Stated in another way, the voltage supply circuit 50 is constituted to be able to apply a voltage, which is within a predetermined range on the basis of a potential at the drain of the signal detection transistor 14A, to the transparent electrode 12Ac of the photoelectric converter 12A during the operation of the imaging device 100.

By applying, to the transparent electrode 12Ac, the voltage within the predetermined range on the basis of the potential at the drain of the signal detection transistor 14A, a predetermined bias can be applied between a principal surface of the photoelectric conversion layer 12Ab on the side close to the pixel electrode 12Aa and a principal surface of the photoelectric conversion layer 12Ab on the side close to the transparent electrode 12Ac. When the photoelectric conversion layer 12Ab in a properly biased state is irradiated with light, the dielectric constant between the pixel electrode 12Aa and the transparent electrode 12Ac is changed. Corresponding to the change caused in the dielectric constant between the pixel electrode 12Aa and the transparent electrode 12Ac by the irradiation of light, an effective gate voltage of the signal detection transistor 14A is also changed, since the gate electrode of the signal detection transistor 14A is electrically connected to the pixel electrode 12Aa. Accordingly, an electric signal corresponding to the change caused in the dielectric constant between the pixel electrode 12Aa and the transparent electrode 12Ac by the irradiation of light to the photoelectric converter 12A is output from the signal detection transistor 14A. Details of optical detection in the pixel cell 10A will be described later.

In the exemplary configuration illustrated in FIG. 1, the address transistor 16A is connected between the signal detection transistor 14A and the output line 54. As seen from the drawing, an address signal line 58 is connected to a gate of the address transistor 16A. The address signal line 58 is disposed for each of the rows of the pixel cells, and the address signal line 58 for each row is connected to the vertical scanning circuit (that may also be called the "row scanning circuit") 60. By controlling a potential of the address signal line 58, the vertical scanning circuit 60 can select the pixel cells in units of row and can read out outputs of the pixel cells, which belong to the selected row, to the corresponding output lines 54. The address transistor 16A may be connected between the first voltage line 51 and the signal detection transistor 14A.

As described above, the basic structure of each of the components in the pixel cell 10B is in common to that of a corresponding component in the pixel cell 10A. For example, the photoelectric converter 12B of the pixel cell 10B includes a pixel electrode 12Ba, a transparent electrode 12Bc, and a photoelectric conversion layer 12Bb sandwiched between those two electrodes. Furthermore, connection relations among the individual components in the pixel cell 10B are basically similar to those among the individual components in the pixel cell 10A. For example, the pixel electrode 12Ba of the photoelectric converter 12B is electrically connected to a gate of the signal detection transistor 14B.

In the embodiment of the present disclosure, however, signal output characteristics with respect to illuminance are different between the pixel cell 10A and the pixel cell 10B. With the signal output characteristics being different between the pixel cell 10A and the pixel cell 10B, one of the pixel cell 10A and the pixel cell 10B can be caused to function as a pixel cell having high sensitivity, and the other can be caused to function as a pixel cell having low sensitivity. Thus, the pixel cells having different sensitivities from each other can be arranged within the pixel array PA.

An image in which halation and black-out are suppressed (i.e., a wider dynamic range image) can be formed in accordance with an image signal obtained from the pixel cell having high sensitivity (hereinafter also referred to as a "high sensitivity signal" in some cases) and an image signal obtained from the pixel cell having low sensitivity (hereinafter also referred to as a "low sensitivity signal" in some cases). Formation of such an image is called "high dynamic range imaging". A dynamic range can be expanded by arranging the pixel cells having different sensitivities from each other within the pixel array PA as described above. Suitable one of known methods can be employed as a practical method for the high dynamic range imaging.

In the embodiment of the present disclosure, a ratio (hereinafter referred to as a "characteristic capacitance ratio") of a capacitance of the photoelectric converter in a state where no light is incident on the photoelectric converter (hereinafter also referred to as a "dark state" in some cases) to a capacitance between a node, which is positioned between the photoelectric converter and the field effect transistor, and a channel region of the field effect transistor is different between the pixel cell 10A and the pixel cell 10B. In this specification, the "channel region" implies a region in a semiconductor where a channel is formed in the field effect transistor. The "channel region" is typically a region sandwiched between a source and a drain of the field effect transistor. As described in detail later, by setting the characteristic capacitance ratio to be different between the pixel cell 10A and the pixel cell 10B, different output characteristics can be obtained between those two pixel cells. In other words, sensitivity can be made different between the pixel cell 10A and the pixel cell 10B.

A characteristic capacitance ratio Ra in the pixel cell 10A is defined as a ratio (Cpd1/Cn1) of a capacitance value Cpd1 to a capacitance value Cn1. Here, Cn1 denotes a value of capacitance between a node Na, which is positioned between the photoelectric converter 12A and the signal detection transistor 14A, and a channel region of the signal detection transistor (field effect transistor) 14A, and Cpd1 denotes a value of capacitance of the photoelectric converter 12A in the dark state.

(Device Structure of Pixel Cell)

A device structure of each pixel cell in the imaging device 100 will be described below with reference to FIG. 2. As described above, it is typical that the basic structure of each of the components in the pixel cell 10B is substantially the same as that of a corresponding component in the pixel cell 10A. In the following, therefore, the device structure in the pixel cell 10A is mainly described, and detailed description of the device structure in the pixel cell 10B is omitted.

Figure 2:
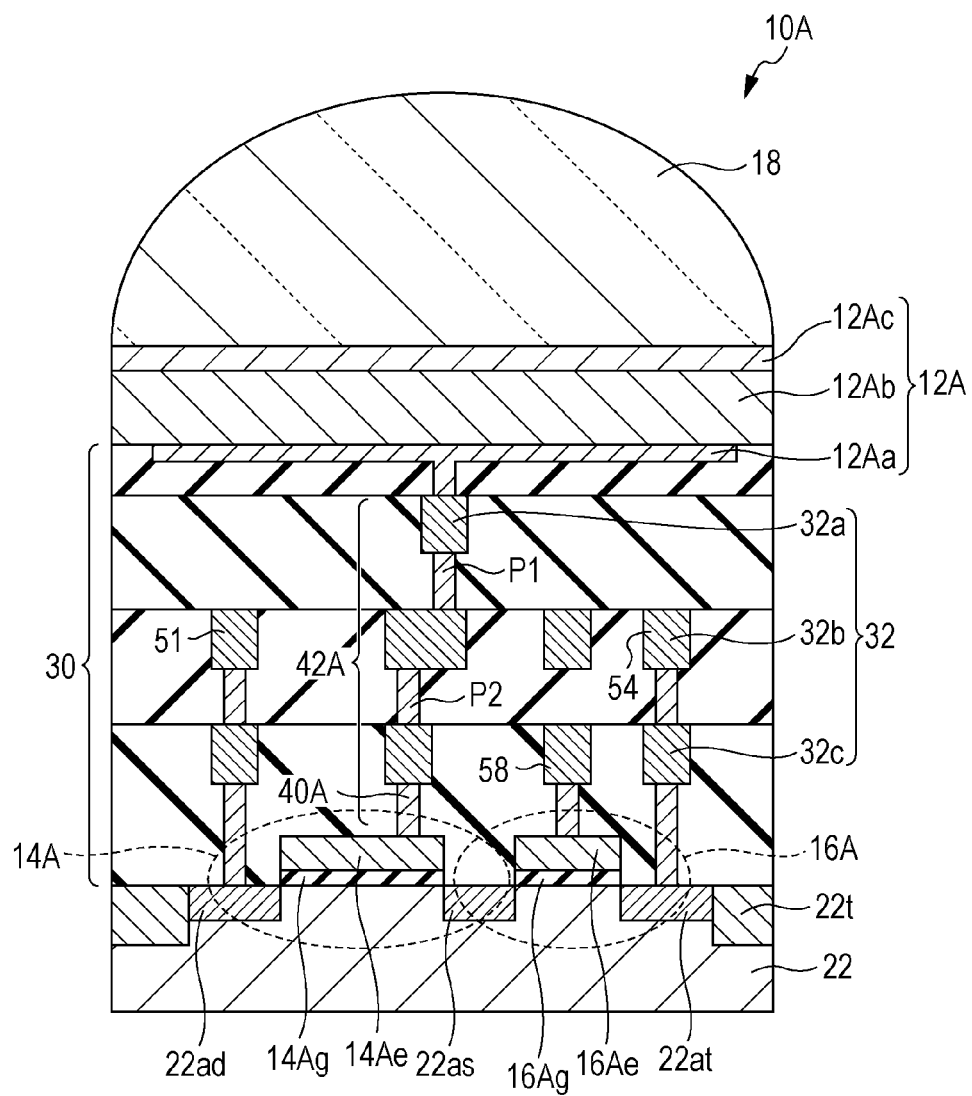
FIG. 2 is a schematic sectional view illustrating a typical example of a device structure in a pixel cell illustrated in FIG. 1.

FIG. 2 schematically illustrates a typical example of the device structure in the pixel cell 10A illustrated in FIG. 1. It is to be noted that FIG. 2 schematically illustrates the layout of individual components constituting the pixel cell 10A, and that sizes of the components illustrated in FIG. 2 do not exactly reflect the sizes in an actual device for some of the components. That point is similarly applied to the other drawings in the present disclosure.

The pixel cells 10A are each formed on a semiconductor substrate 22. In the illustrated example, the semiconductor substrate 22 is a p-type silicon (Si) substrate. Each pixel cell 10A is electrically isolated from the pixel cells 10B and the other pixel cell 10A by element isolation regions 22t formed in the semiconductor substrate 22. The "semiconductor substrate" used in this specification is not limited to a substrate entirely made of a semiconductor, and it may be, e.g., an insulating substrate including a semiconductor layer that is formed on a surface at the side irradiated with light.

The pixel cell 10A includes the photoelectric converter 12A, the signal detection transistor 14A, and the address transistor 16A. In the illustrated example, the signal detection transistor 14A and the address transistor 16A are formed on the semiconductor substrate 22.

The photoelectric converter 12A includes the pixel electrode 12Aa arranged on an interlayer insulating layer 30 that is formed to cover the semiconductor substrate 22, the transparent electrode 12Ac, and the photoelectric conversion layer 12Ab arranged between the pixel electrode 12Aa and the transparent electrode 12Ac.

The pixel electrode 12Aa is spatially separated from pixel electrodes of other adjacent pixel cells (for example, each being the pixel cell 10A or the pixel cell 10B), whereby it is electrically isolated from the pixel electrodes of the other pixel cells. The pixel electrode 12Aa is typically a metal electrode or a metal nitride electrode. Examples of materials usable to form the pixel electrode 12Aa are Al, Cu, Ti, TiN, Ta, TaN, Mo, Ru, and Pt. Alternatively, the pixel electrode 12Aa may be formed of, e.g., polysilicon that is doped with impurities to be given with conductivity. In the embodiment, a TiN electrode is used as the pixel electrode 12Aa. In the case of forming the pixel electrode 12Aa as a light-shielding electrode, stray light is suppressed from coming into the channel region of the signal detection transistor 14A and/or the channel region of the address transistor 16A.

In the photoelectric converter 12A, the transparent electrode 12Ac is arranged on one of two principal surfaces of the photoelectric conversion layer 12Ab on the side where light is incident. Accordingly, part of the light incident on the pixel cell 10A, the part having transmitted through the transparent electrode 12Ac, is incident on the photoelectric conversion layer 12Ab. The light detected by the imaging device 100 is not limited to light within a wavelength range of visible light (e.g., from 380 nm to 780 nm). In this specification, overall electromagnetic waves including infrared rays and ultraviolet rays are expressed by "light" for the sake of convenience. The words "transparent" and "light transmission" used in this specification imply the property of allowing transmission of at least part of light in a wavelength range to be detected, and it is not essential to allow transmission of light in an entire wavelength range of visible light.

When the imaging device 100 is utilized as an infrared detector, for example, a transparent conducting oxide (TCO) having a high transmittance for near infrared rays and a small resistance value is used as a material of the transparent electrode 12Ac. For example, ITO, IZO, AZO, FTO, $SnO_2$, $TiO_2$, or $ZnO_2$ can be used as TCO. Alternatively, a metal thin film made of, e.g., Au, may be used as the transparent electrode 12Ac.

The transparent electrode 12Ac is connected to the second voltage line 52 (not illustrated in FIG. 2) such that the predetermined voltage (i.e., the second bias voltage) can be applied to the transparent electrode 12Ac during the operation of the imaging device 100. As illustrated in FIG. 2, a microlens 18 for condensing the irradiated light to be incident on the photoelectric conversion layer 12Ab may be arranged in an opposing relation to the transparent electrode 12Ac. An infrared-ray transmission filter, a protective layer, etc. may be arranged between the microlens 18 and the transparent electrode 12Ac.

The photoelectric conversion layer 12Ab arranged between the transparent electrode 12Ac and the pixel electrode 12Aa has a thickness of, e.g., about 200 nm (the thickness being a length measured in a normal direction of the semiconductor substrate 22). The photoelectric conversion layer 12Ab receives the light incoming through the transparent electrode 12Ac and generates positive and negative charges (typically, electron-hole pairs) in the photoelectric conversion layer 12Ab. A semiconductor material is typically used as a material of the photoelectric conversion layer 12Ab. In the embodiment, the photoelectric conversion layer 12Ab is formed of an organic semiconductor material. A typical example of configuration of the photoelectric conversion layer 12Ab will be described later.

In the configuration illustrated in FIG. 2, the interlayer insulating layer 30 supporting the photoelectric converter 12A has a multilayer structure including a plurality of insulating layers (typically, silicon oxide films), and a multilayer wiring 32 is disposed in the interlayer insulating layer 30. In an example illustrated in FIG. 2, the interlayer insulating layer 30 includes four insulating layers, and the multilayer wiring 32 includes three wiring layers (i.e., wiring layers 32a, 32b and 32c). The number of the insulating layers in the interlayer insulating layer 30 and the number of the wiring layers in the multilayer wiring 32 are not limited to the above-mentioned examples.

Among the wiring layers 32a to 32c in the multilayer wiring 32, the wiring layer 32a arranged farthest apart from the semiconductor substrate 22 is connected to the pixel electrode 12Aa. The wiring layer 32a is connected to the wiring layer 32b through a plug P1, and the wiring layer 32b is connected, through a plug P2, to the wiring layer 32c that is arranged closest to the semiconductor substrate 22. The multilayer wiring 32 and the plugs P1 and P2 are each formed of a metal, e.g., copper. A light-shielding film may be formed by the wiring layer in the multilayer wiring 32 (e.g., at least one of the wiring layers 32a to 32c).

In the pixel cell 10A, the wiring layer 32c and a gate electrode 14Ae of the signal detection transistor 14A are connected to each other through a contact plug 40A. The wiring layers 32a to 32c, the plugs P1 and P2, and the contact plug 40A constitute a connecting portion 42A that electrically connects the pixel electrode 12Aa and the gate electrode 14Ae.

The signal detection transistor 14A includes the gate electrode 14Ae, a gate insulating layer 14Ag arranged between the gate electrode 14Ae and the semiconductor substrate 22, and impurity regions 22ad and 22as both formed in the semiconductor substrate 22. Typically, the gate electrode 14Ae is a polysilicon electrode, and the gate insulating layer 14Ag is a thermal oxide film of silicon (i.e., a silicon dioxide film). The gate insulating layer 14Ag has a thickness of about 4.6 nm, for example. A High-k film, such as an $HfO_2$ film, may be used as the gate insulating layer 14Ag. A thickness of the gate insulating layer 14Ag may be appropriately set depending on the material of the gate insulating layer 14Ag. The impurity region (n-type region in the embodiment) 22ad functions as a drain region of the signal detection transistor 14A, while the impurity region (n-type region in the embodiment) 22as functions as a source region of the signal detection transistor 14A. As schematically illustrated in FIG. 2, the first voltage line 51 is connected to the impurity region 22ad.

The address transistor 16A includes impurity regions 22as and 22at both formed on the semiconductor substrate 22, a gate insulating layer 16Ag on the semiconductor substrate 22, and a gate electrode 16Ae on the gate insulating layer 16Ag. Typically, the gate insulating layer 16Ag of the address transistor 16A and the gate insulating layer 14Ag of the signal detection transistor 14A are positioned in the same layer. The gate electrode 16Ae of the address transistor 16A and the gate electrode 14Ae of the signal detection transistor 14A are positioned in the same layer.

The impurity region 22as functions as a drain region of the address transistor 16A, while the impurity region 22at functions as a source region of the address transistor 16A. In the illustrated example, the address transistor 16A and the signal detection transistor 14A share the impurity region 22as. As schematically illustrated in FIG. 2, the output line 54 is connected to the impurity region 22at. Furthermore, the address signal line 58 is connected to the gate electrode 16Ae of the address transistor 16A. Accordingly, an output of the signal detection transistor 14A can be selectively read out to the output line 54 by controlling a potential of the gate electrode 16Ae through the address signal line 58 to turn on the address transistor 16A. The signal detection transistor 14A and the address transistor 16A constitute a signal detection circuit that detects the light incident on the photoelectric converter 12A. In the illustrated example, the first voltage line 51, the output line 54, and the wiring layer 32b are positioned in the same layer, while the address signal line 58 and the wiring layer 32c are positioned in the same layer.

At a glance, the device structure illustrated in FIG. 2, by way of example, is analogous to a device structure of a pixel cell in a multilayered image sensor in which a photoelectric conversion layer is disposed on a semiconductor substrate. In the multilayered image sensor, however, a comparatively high bias voltage is applied between a pixel electrode opposing to one principal surface of the photoelectric conversion layer and a transparent electrode opposing to the other principal surface thereof, and positive or negative charges generated with the photoelectric conversion are collected as signal charges at the pixel electrode. On the other hand, in the pixel cell in the imaging device according to the present disclosure, the potential difference (bias) between the two principal surfaces of the photoelectric conversion layer is maintained within a predetermined range during detection of light. As described later, when the potential difference between the two principal surfaces of the photoelectric conversion layer is within the predetermined range, there hardly occur drifts of charges from the photoelectric conversion layer to the electrodes (i.e., the pixel electrode and the transparent electrode) and drifts of charges from the electrodes (i.e., the pixel electrode and the transparent electrode) to the photoelectric conversion layer. Stated in another way, in the embodiment of the present disclosure, the charges generated with the photoelectric conversion are not taken out to the exterior of the photoelectric conversion layer, and are kept within the photoelectric conversion layer. By keeping the charges generated with the photoelectric conversion to be held in the photoelectric conversion layer, change in the illuminance applied to the photoelectric conversion layer can be detected as change in the dielectric constant between the pixel electrode 12a and the transparent electrode 12c.

(Principle of Optical Detection)

Figure 3:
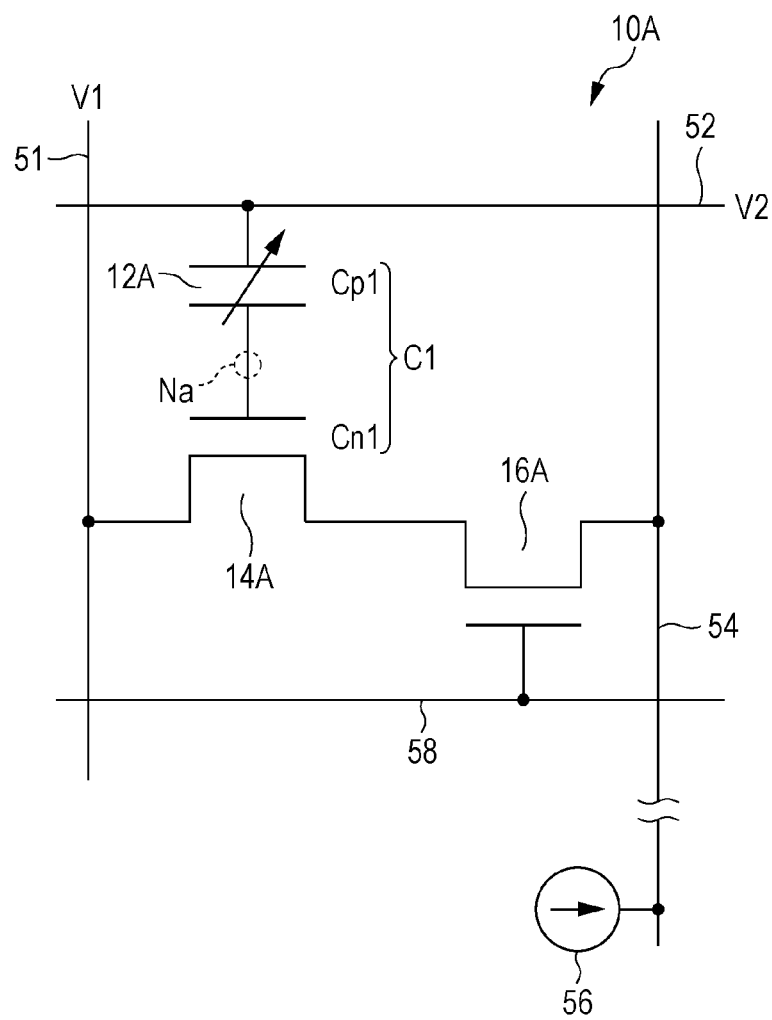
FIG. 3 is an equivalent circuit diagram of the pixel cell during detection of light.

FIG. 3 illustrates an equivalent circuit of the pixel cell 10A during detection of light. In the operation of detecting the light, the predetermined bias is applied to the photoelectric conversion layer 12Ab. FIG. 3 represents a state where a voltage V1 is supplied to the first voltage line 51 and a voltage V2 is supplied to the second voltage line 52, whereby the predetermined bias is applied to the photoelectric conversion layer 12Ab of the photoelectric converter 12A. A value of the voltage V1 is, e.g., 2.4 V (power supply voltage VDD, for example), and a value of the voltage V2 is, e.g., 2.5 V. Thus, in the example described here, a potential difference of about 0.1 V is applied between the two principal surfaces of the photoelectric conversion layer 12Ab.

As described above, when the potential difference between the two principal surfaces of the photoelectric conversion layer 12Ab is within the predetermined range, there hardly occur the drifts of charges between the photoelectric conversion layer 12Ab and each of the pixel electrode 12Aa and the transparent electrode 12Ac. Accordingly, when the bias applied to the photoelectric conversion layer 12Ab is within the predetermined range, the photoelectric converter 12A can be regarded as a capacitive element.

The photoelectric conversion layer 12Ab generates pairs of positive and negative charges therein with the irradiation of the light. As described later in detail, the dielectric constant between the pixel electrode 12Aa and the transparent electrode 12Ac is changed with the generation of the pairs of positive and negative charges in the photoelectric conversion layer 12Ab in the state where the predetermined bias is applied to the photoelectric conversion layer 12Ab. Thus, a capacitance value Cp1 of the photoelectric converter 12A represents a magnitude depending on the illuminance applied to the photoelectric conversion layer 12Ab. Since the capacitance value Cp1 of the photoelectric converter 12A is changed depending on the illuminance, the photoelectric converter 12A is expressed in FIG. 3 by a circuit symbol similar to that used to express a variable capacitor.

As described above with reference to FIG. 2, the photoelectric converter 12A is electrically connected to the gate electrode 14Ae of the signal detection transistor 14A. Therefore, change in the capacitance of the photoelectric converter 12A affects the effective gate voltage of the signal detection transistor 14A. Assuming here a set of the photoelectric converter 12A and the signal detection transistor 14A to be one field effect transistor, a gate capacitance value C1 of that field effect transistor is expressed by the capacitance value Cp1 and a capacitance value Cn1 between the node Na and the channel region of the signal detection transistor (field effect transistor) 14A. More specifically, $C1=(Cp1 \times Cn1/(Cp1+Cn1))$ is held.

The capacitance (denoted by the capacitance value Cn1) between the node Na and the channel region of the signal detection transistor 14A includes a capacitance of the gate insulating layer 14Ag of the signal detection transistor 14A, a parasitic capacitance of the connecting portion 42A that connects the gate electrode 14Ae of the signal detection transistor 14A and the photoelectric converter 12A, a capacitance formed by electrical coupling between the connecting portion 42A and other wiring lines and electrodes, etc. The capacitance value Cn1 is determined by the structure of the pixel cell 10A, and it is not changed with the illuminance. On the other hand, the capacitance value Cp1 of the photoelectric converter 12A is changed depending on the illuminance applied to the photoelectric conversion layer 12Ab. As seen from that the formula expressing the gate capacitance value C1 contains the capacitance value Cp1, the gate capacitance value C1 is also changed depending on the illuminance.

As well known, the magnitude of a drain current in a field effect transistor is in proportion to a capacitance value of a gate insulating layer. Thus, a drain current (i.e., a current flowing between the impurity regions 22as and 22ad) of the signal detection transistor 14A exhibits a magnitude substantially in proportion to the gate capacitance value $C1=(Cp1 \times Cn1/(Cp1+Cn1))$ when a set of the photoelectric converter 12A and the signal detection transistor 14A is assumed to be one field effect transistor. In other words, the irradiation of the light to the photoelectric conversion layer 12Ab causes a similar effect to the change in the gate capacitance of the field effect transistor, and a threshold voltage of the signal detection transistor 14A is changed depending on the illuminance. Thus, the light can be detected by utilizing the above-mentioned change.

In the illustrated example, the constant-current source 56 is connected to the output line 54. Accordingly, the change in the threshold voltage of the signal detection transistor 14A, which is attributable to the irradiation of the light to the pixel cell 10A, can be detected as change in the voltage of the output line 54. Stated in another way, the light can be detected in accordance with the change in the voltage of the output line 54. On that occasion, the first voltage line 51 functions as a source follower power supply. The light may be detected by detecting, instead of the voltage of the output line 54, a current that is output from the impurity region 22as (see FIG. 2) of the signal detection transistor 14A. For example, a constant-voltage source may be connected to the output line 54 to detect change in a current in the output line 54. However, it is more advantageous to detect the voltage change from the viewpoints that a similar process and circuit to those utilized for a photosensor using a silicon photodiode can be applied, and that a higher S/N ratio can be obtained.

(Relation between Characteristic Capacitance Ratio and Sensitivity of Pixel Cell)

The relation between the above-described characteristic capacitance ratio and sensitivity of the pixel cell will be described below with reference to FIGS. 4 and 5.

As known, a threshold voltage in a field effect transistor is in inverse proportion to a capacitance value of a gate insulating layer. In the imaging device according to the present disclosure, the threshold voltage of the signal detection transistor (field effect transistor) 14A at a certain level of illuminance is substantially in inverse proportion to the gate capacitance value C1. The gate capacitance value C1 is expressed by the capacitance value Cp1 of the photoelectric converter 12A and the capacitance value Cn1 between the node Na and the channel region of the signal detection transistor (field effect transistor) 14A. Thus, the sensitivity of the pixel cell 10A can be featured by the capacitance value Cp1 of the photoelectric converter and the capacitance value Cn1 between the node Na and the channel region of the signal detection transistor (field effect transistor) 14A. For example, it can be said that a ratio (Cp1/Cn1) of the capacitance value Cp1 of the photoelectric converter to the capacitance value Cn1 between the node Na and the channel region of the signal detection transistor (field effect transistor) 14A represents the sensitivity of the pixel cell 10A. However, the capacitance value Cp1 of the photoelectric converter 12A takes a different value depending on the illuminance. Accordingly, a characteristic capacitance ratio Ra ($=Cpd1/Cn1$) is defined using the capacitance value Cpd1 of the photoelectric converter 12A in the dark state.

The sensitivity of the pixel cell 10A is featured by the characteristic capacitance ratio Ra. Similarly, regarding the pixel cell 10B, a characteristic capacitance ratio Rb ($=Cpd2/Cn2$) can be defined using a capacitance value Cpd2 of the photoelectric converter 12B in the dark state, and the sensitivity of the pixel cell 10B is featured by the characteristic capacitance ratio Rb. Here, Cn2 denotes the capacitance value between a node Nb, which is positioned between the photoelectric converter 12B and the signal detection transistor 14B, and a channel region of the signal detection transistor (field effect transistor) 14B.

Figure 4:
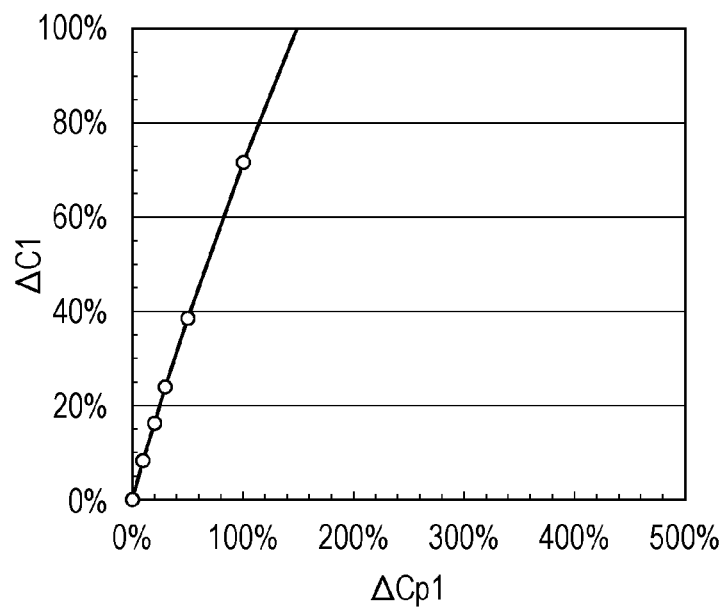
FIG. 4 is a graph depicting one example of a result of calculating change in a gate capacitance value C1 relative to change in a capacitance value Cp1 of a photoelectric converter when a set of the photoelectric converter and a signal detection transistor is regarded as one field effect transistor.
Figure 5:
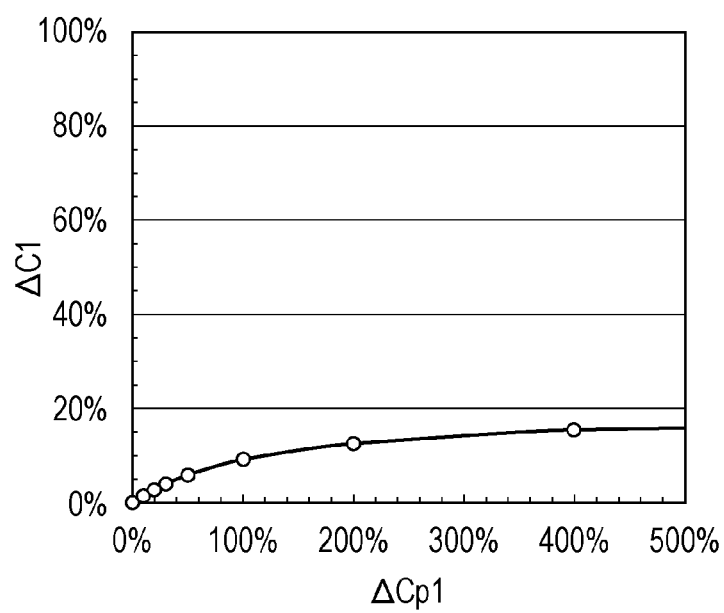
FIG. 5 is a graph depicting another example of the result of calculating change in the gate capacitance value C1 relative to change in the capacitance value Cp1 of the photoelectric converter when a set of the photoelectric converter and the signal detection transistor is regarded as one field effect transistor.

FIGS. 4 and 5 illustrate examples of a result of calculating change in the gate capacitance value C1 relative to change in the capacitance value Cp1 of the photoelectric converter 12A. FIG. 4 is a graph when (Cpd1/Cn1)=(1/5), namely when the characteristic capacitance ratio Ra is (1/5). FIG. 5 is a graph when (Cpd1/Cn1)=5, namely when the characteristic capacitance ratio Ra is 5.

The horizontal axis in each of the graphs of FIGS. 4 and 5 denotes a change rate ΔCp1 of the capacitance value Cp1 when the illuminance applied to the pixel cell 10A is changed. On the horizontal axis, 100% represents the change rate when a capacitance value, which is, e.g., twice the capacitance value at a certain level of the illuminance, is obtained by changing the illuminance. The vertical axis in each of the graphs of FIGS. 4 and 5 denotes a change rate ΔC1 of the gate capacitance value C1 relative to change in the capacitance value Cp1. On the vertical axis, 100% represents the change rate at which the gate capacitance value C1 is, e.g., twice relative to the change in the capacitance value Cp1.

As seen from comparing FIGS. 4 and 5, at the characteristic capacitance ratio Ra being smaller, the change rate ΔC1 increases at a larger gradient relative to an increase in the change rate ΔCp1 of the capacitance value Cp1 of the photoelectric converter 12A. Such a result indicates that, when the characteristic capacitance ratio Ra is comparatively small, the threshold voltage of the signal detection transistor 14A is promptly responsive to even small change in the illuminance. In other words, as the characteristic capacitance ratio Ra has a smaller value, the pixel cell 10A takes higher sensitivity. Comparing sensitivity at a point of ΔCp1=100(%), for example, it is seen that a sensitivity difference between the pixel cell 10A with the characteristic capacitance ratio Ra having a value of (1/5) (FIG. 4) and the pixel cell 10A with the characteristic capacitance ratio Ra having a value of 5 (FIG. 5) is about 7 times.

At different values of the characteristic capacitance ratio, the current output from the signal detection transistor takes different magnitudes even with irradiation at the same illuminance. Thus, even under condition of the same illuminance, different image signals are obtained between the pixel cells having different characteristic capacitance ratios. The imaging device 100 is equipped with the pixel array PA including the pixel cell 10A having the characteristic capacitance ratio Ra and the pixel cell 10B having a characteristic capacitance ratio Rb which has a value different from that of the characteristic capacitance ratio Ra. In the case of Ra<Rb, for example, a high sensitivity signal is obtained by the pixel cell 10A designed to have relatively high sensitivity, and a low sensitivity signal is obtained by the pixel cell 10B designed to have relatively low sensitivity. In other words, image data in accordance with the output signal of the pixel cell having high sensitivity, and image data in accordance with the output signal of the pixel cell having low sensitivity can be both obtained with one shot of image-taking.

There are various methods for making the characteristic capacitance ratio different between the different pixel cells. Examples of a manner of adjusting the characteristic capacitance ratio in the pixel cell will be described below with reference to FIGS. 6 and 7.

Figure 6:
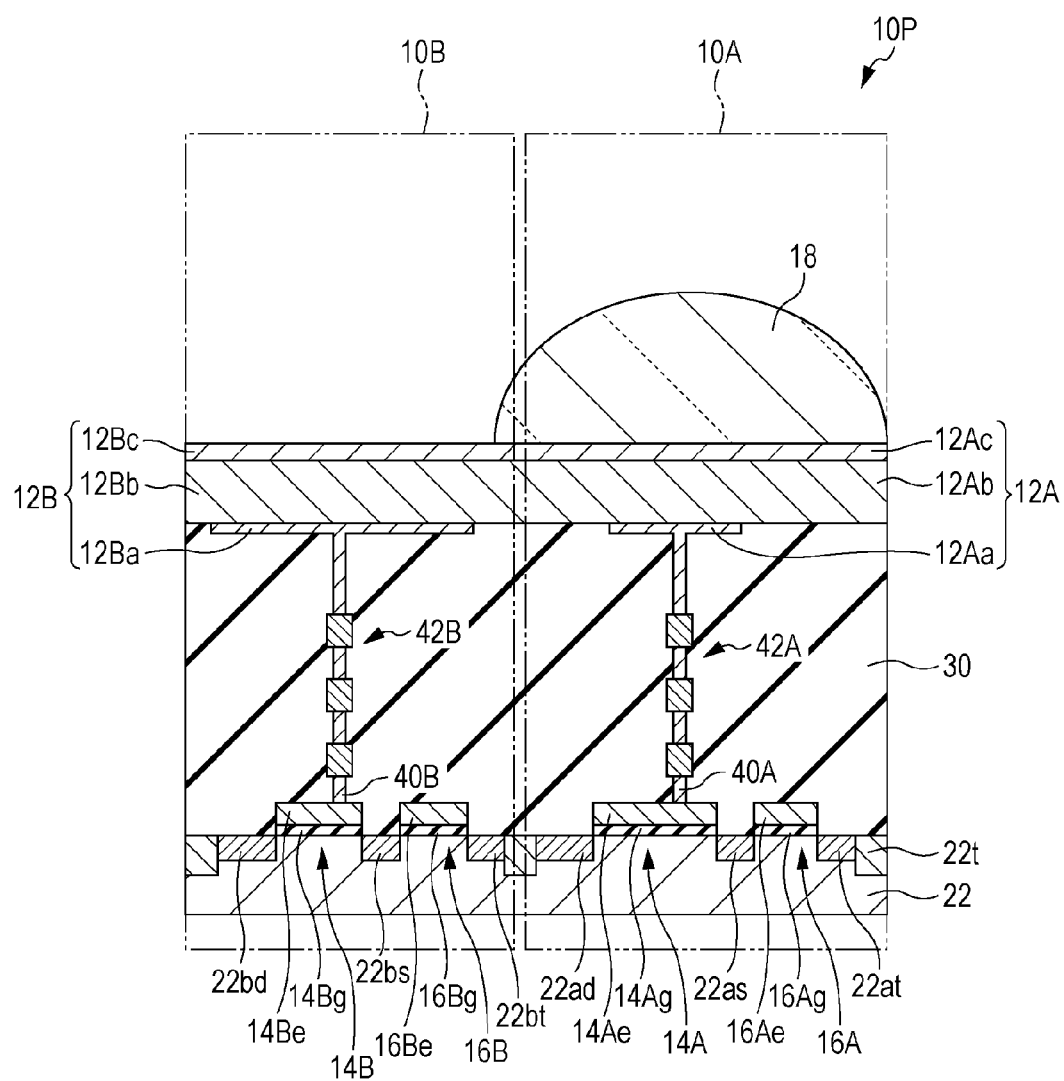
FIG. 6 is a schematic sectional view of a pixel cell pair including different pixel cells that are arranged adjacent to each other.
Figure 7:
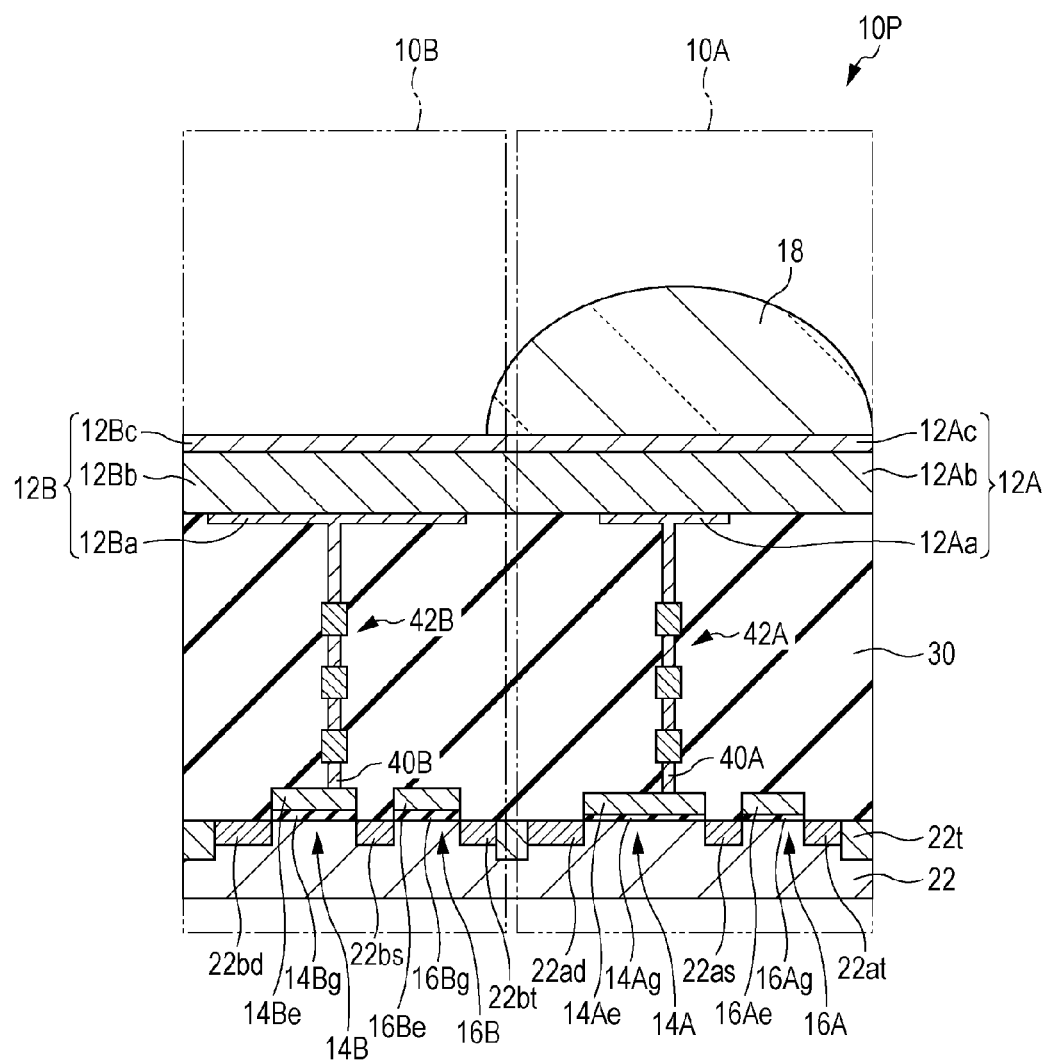
FIG. 7 is a schematic sectional view of a pixel cell pair including different pixel cells that are arranged adjacent to each other.

FIGS. 6 and 7 each schematically illustrate a section of a pixel cell pair 10P including the pixel cells 10A and 10B that are arranged adjacent to each other. It is to be noted that, in FIGS. 6 and 7, some of the components, such as the output line 54, is omitted for the sake of avoiding complexity of the drawings.

As illustrated in FIGS. 6 and 7, the signal detection transistor 14B of the pixel cell 10B includes impurity regions 22*bd* and 22*bs* both formed in the semiconductor substrate 22, a gate insulating layer 14Bg on the semiconductor substrate 22, and a gate electrode 14Be on the gate insulating layer 14Bg. As illustrated, the gate electrode 14Be of the signal detection transistor 14B is electrically connected to the pixel electrode 12Ba of the photoelectric converter 12B through a connecting portion 42B that includes a contact plug 40B in its part. The address transistor 16B of the pixel cell 10B includes impurity regions 22*bs* and 22*bt* both formed in the semiconductor substrate 22, a gate insulating layer 16Bg on the semiconductor substrate 22, and a gate electrode 16Be on the gate insulating layer 16Bg. The address transistor 16B shares the impurity region 22*bs* with the signal detection transistor 14B.

The signal detection transistor 14A of the pixel cell 10A outputs an electric signal corresponding to change in the dielectric constant between the pixel electrode 12Aa and the transparent electrode 12Ac, the change being caused by incidence of light on the photoelectric conversion layer 12Ab through the transparent electrode 12Ac. Likewise, the signal detection transistor 14B of the pixel cell 10B outputs an electric signal corresponding to change in the dielectric constant between the pixel electrode 12Ba and the transparent electrode 12Bc, the change being caused by incidence of light on the photoelectric conversion layer 12Bb through the transparent electrode 12Bc.

In a configuration illustrated in FIG. 6, by way of example, an area of the pixel electrode 12Aa in the pixel cell 10A and an area of the pixel electrode 12Ba in the pixel cell 10B are different from each other when viewed in the normal direction of the semiconductor substrate 22. By setting the area of the pixel electrode to be different between the pixel cell 10A and the pixel cell 10B, the capacitance value Cpd1 of the photoelectric converter 12A in the dark state and the capacitance value Cpd2 of the photoelectric converter 12B in the dark state can take values different from each other. Accordingly, the characteristic capacitance ratio can be made different between the pixel cell 10A and the pixel cell 10B. For example, in the case of designing the pixel cell 10A to function as the pixel cell having high sensitivity and the pixel cell 10B to function as the pixel cell having low sensitivity, the area of the pixel electrode 12Aa in the pixel cell 10A may be set smaller than that of the pixel electrode 12Ba in the pixel cell 10B. The capacitance (denoted by a capacitance value Cn2) between the node Nb and the channel region of the signal detection transistor (field effect transistor) 14B includes a capacitance of the gate insulating layer 14Bg of the signal detection transistor 14B, a parasitic capacitance of the connecting portion 42B that connects the gate electrode 14Be of the signal detection transistor 14B and the photoelectric converter 12B, a capacitance formed by electrical coupling between the connecting portion 42B and other wiring lines and electrodes, etc.

Alternatively, the thickness of the photoelectric conversion layer 12Ab of the pixel cell 10A and the thickness of the photoelectric conversion layer 12Bb of the pixel cell 10B may be set different from each other. Also in that case, the capacitance value Cpd1 and the capacitance value Cpd2 can take different values. Furthermore, in the example illustrated in FIG. 6, the photoelectric conversion layer 12Bb of the pixel cell 10B and the photoelectric conversion layer 12Ab of the pixel cell 10A are formed as a continuous single photoelectric conversion layer. With such a configuration, because the photoelectric conversion layer 12Bb and the photoelectric conversion layer 12Ab can be formed together, a manufacturing process can be avoided from being complicated.

Moreover, in the illustrated example, the transparent electrode 12Bc of the pixel cell 10B and the transparent electrode 12Ac of the pixel cell 10A are formed as a continuous single electrode. With such a configuration, because the transparent electrode 12Bc and the transparent electrode 12Ac can be formed together, a manufacturing process can be avoided from being complicated. In the case of forming each of the transparent electrode 12Bc and the transparent electrode 12Ac as part of a continuous single electrode, the second bias voltage can be applied to a plurality of pixel cells (i.e., the pixel cells 10A and 10B) together in a simpler way. As a matter of course, if the predetermined potential difference can be applied between the transparent electrode 12Ac and the impurity region 22*ad* and between the transparent electrode 12Bc and the impurity region 22*bd* during the operation of the imaging device 100, the transparent electrode 12Ac and/or the transparent electrode 12Bc may be formed in a state separated per pixel cell.

As illustrated in FIG. 6, a size of the signal detection transistor 14A and a size of the signal detection transistor 14B may be set different from each other. The signal detection transistor 14A and the signal detection transistor 14B may be designed, for example, to have different gate widths (the gate width representing a length of the gate electrode measured in a direction perpendicular to the direction interconnecting the source and the drain). For example, when the gate width is set different between the signal detection transistor 14A and the signal detection transistor 14B, an area of the gate insulating layer 14Ag and an area of the gate insulating layer 14Bg can be made different from each other when viewed in the normal direction of the semiconductor substrate 22. As described above, the capacitance value Cn1 in the pixel cell 10A may include the capacitance of the gate insulating layer 14Ag of the signal detection transistor 14A. The capacitance value Cn2 in the pixel cell 10B may include the capacitance of the gate insulating layer 14Bg of the signal detection transistor 14B. Accordingly, by setting, for example, the gate width to be different between the signal detection transistor 14A and the signal detection transistor 14B, the capacitance value Cn1 and the capacitance value Cn2 can be made different from each other, and the characteristic capacitance ratio can take different values between the pixel cell 10A and the pixel cell 10B. For example, in the case of designing the pixel cell 10A to function as the pixel cell having high sensitivity and the pixel cell 10B to function as the pixel cell having low sensitivity, the area of the gate insulating layer 14Ag in the pixel cell 10A may be set larger than that of the gate insulating layer 14Bg in the pixel cell 10B.

Alternatively, as illustrated in FIG. 7, the thickness of the gate insulating layer 14Ag of the signal detection transistor 14A and the thickness of the gate insulating layer 14Bg of the signal detection transistor 14B may be set different from each other. For example, in the case of designing the pixel cell 10A to function as the pixel cell having high sensitivity and the pixel cell 10B to function as the pixel cell having low sensitivity, the thickness of the gate insulating layer 14Ag in the pixel cell 10A may be set smaller than that of the gate insulating layer 14Bg in the pixel cell 10B. Also with such a configuration, the capacitance value Cn1 and the capacitance value Cn2 can be obtained as different values. Thus, a sensitivity ratio between the pixel cell 10A and the pixel cell 10B can also be adjusted by adjusting the capacitance of the gate insulating layer 14Ag of the signal detection transistor 14A and/or the capacitance of the gate insulating layer 14Bg of the signal detection transistor 14B.

Other than the above-described methods, a wiring layout may be set different between the pixel cell 10A and the pixel cell 10B. As an alternative, wiring lines having different thicknesses or lengths may be used in the pixel cell 10A and the pixel cell 10B. With such a configuration, a comparatively large difference can be generated between the capacitance, which is formed due to electrical coupling between the connecting portion 42A of the pixel cell 10A and the other wiring lines, and the capacitance, which is formed due to electrical coupling between the connecting portion 42B of the pixel cell 10B and the other wiring lines. Thus, the characteristic capacitance ratio can also take different values between the pixel cell 10A and the pixel cell 10B by setting the parasitic capacitance between the connecting portion and the wiring lines to be different between the pixel cell 10A and the pixel cell 10B. For example, a shield electrode may be disposed around at least one of the connecting portion 42A of the pixel cell 10A and the connecting portion 42B of the pixel cell 10B.

The above-described various methods can be applied alone or in a combination of two or more among those methods. A still another method of changing sensitivity by setting light condensing characteristics in the pixel cell 10A and light condensing characteristics in the pixel cell 10B to be different from each other can be further used. The light condensing characteristics in the pixel cell 10A and the light condensing characteristics in the pixel cell 10B can be made different from each other by changing, e.g., the layout or the number of the microlenses 18. For example, in the case of designing the pixel cell 10A to function as the pixel cell having high sensitivity and the pixel cell 10B to function as the pixel cell having low sensitivity, the pixel cells may be constituted such that the microlens is disposed in the pixel cell 10A, whereas no microlens is disposed in the pixel cell 10B. With that configuration, the light condensing characteristics in the pixel cell 10A can be made superior to those in the pixel cell 10B.

Figure 8:
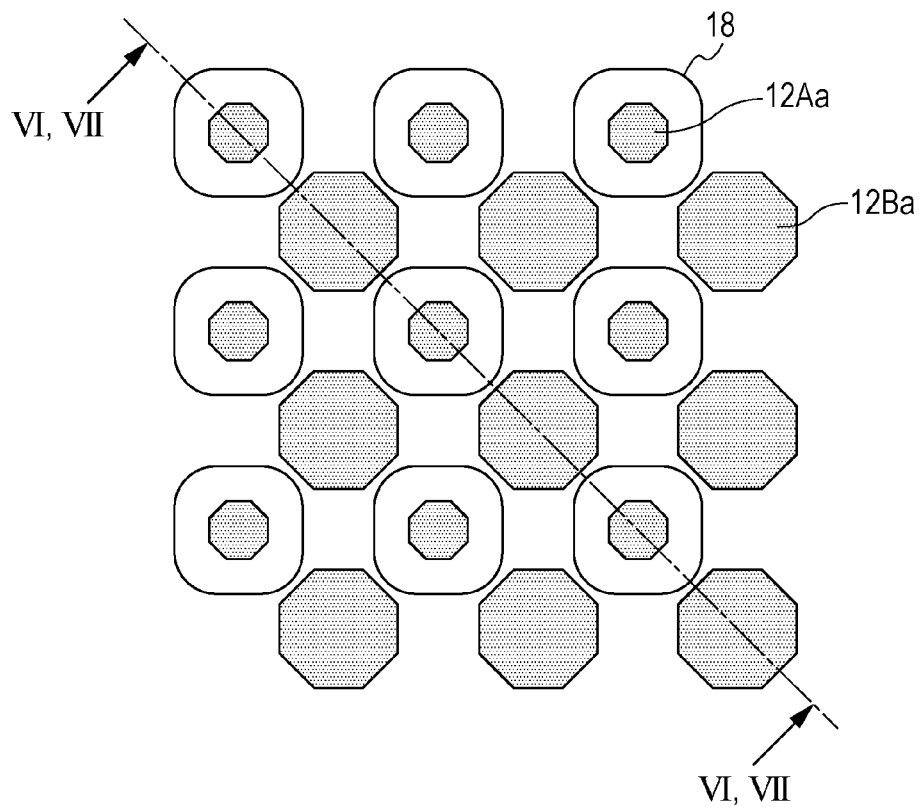
FIG. 8 is a plan view illustrating one example of layout of microlenses when viewed in a normal direction of a semiconductor substrate.
Figure 9:
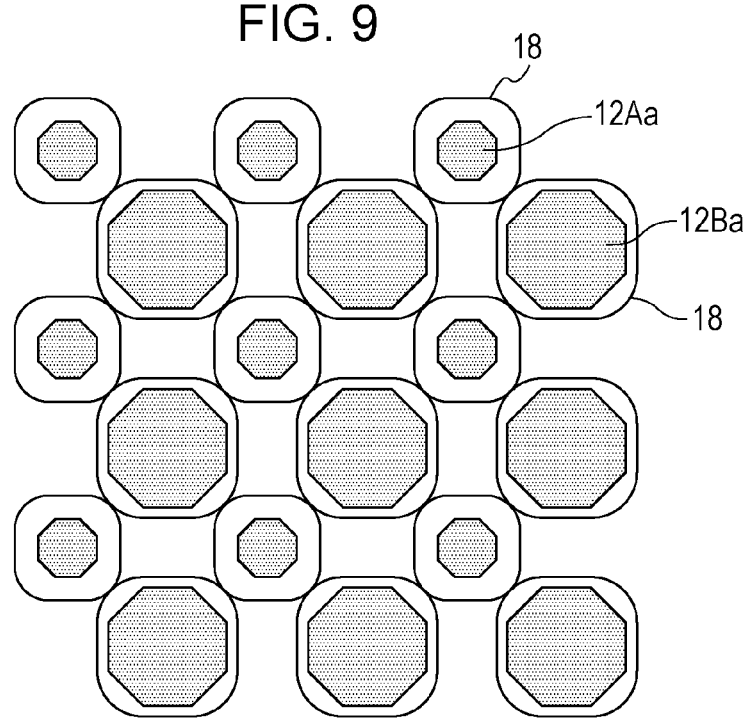
FIG. 9 is a plan view illustrating another example of layout of the microlenses when viewed in the normal direction of the semiconductor substrate.

As schematically illustrated in FIG. 8, by way of example, the microlens 18 may be selectively disposed in an upper portion of one of the pixel cell 10A and the pixel cell 10B. By condensing the incident light through the microlens, it is possible to make capacity change in the photoelectric converter 12A larger than that in the photoelectric converter 12B, and to further increase the sensitivity ratio between the pixel cell 10A and the pixel cell 10B. Alternatively, as illustrated in FIG. 9, the microlenses 18 having different area ratios with respect to the corresponding pixel electrodes may be disposed in the upper portions of both the pixel cell 10A and the pixel cell 10B. With such a configuration, the sensitivity ratio can be increased while dependency of the sensitivity of the pixel cell 10A and the pixel cell 10B upon an incidence angle is kept uniform.

In the configuration illustrated in FIG. 8, the plurality of the pixel cells 10A and the plurality of pixel cells 10B are both arrayed in a matrix pattern. However, the array of the pixel cells 10B is shifted relative to the array of the pixel cells 10A in each of the row direction and the column direction by about half the pixel pitch of the pixel cells 10A. Thus, in the imaging device 100 according to the present disclosure, the centers of the pixel cells 10A and the centers of the pixel cells 10B are all not always required to position at lattice points of a square lattice. It is to be noted that FIGS. 6 and 7 each correspond to a sectional view taken along a line VI (VII)-VI (VII) in FIG. 8.

(Photoelectric Conversion Layer)

Typical examples of configurations of the photoelectric conversion layers 12Ab and 12Bb will be described in detail below.

The photoelectric conversion layers 12Ab and 12Bb contain, for example, tin naphthalocyanine expressed by the following general formula (1) (hereinafter simply called "tin naphthalocyanine" in some cases).

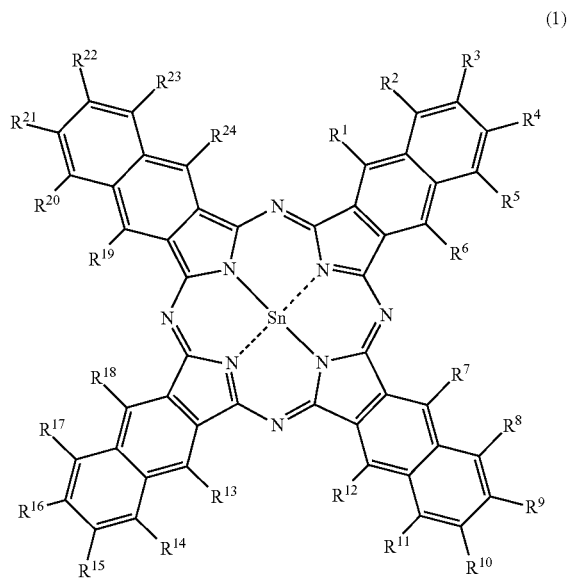

(1)

In the above general formula (1), $R^1$ to $R^{24}$ denote hydrogen atoms or substituents independently of one another. The substituents are not limited to particular substituents. The substituents may be a deuterium atom, a halogen atom, alkyl groups (including a cycloalkyl group, a bicycloalkyl group, and a tricycloalkyl group), alkenyl groups (including a cycloalkenyl group and a bicycloalkenyl group), an alkynyl group, an aryl group, a heterocyclic group (also called a heterocyclic ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxy carbonyloxy group, amino groups (including an anilino group), an ammonio group, an acylamino group, an aminocarbonyl amino group, an alkoxycarbonyl amino group, an aryloxycarbonyl amino group, a sulfamoylamino group, an alkylsulfonyl amino group, an arylsulfonyl amino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxy carbonyl group, an alkoxycarbonyl group, a carbamoyl group, an arylazo group, a heterocyclic azo group, an imide group, a phosphino group, a phosphinyl group, a phosphinyloxy group, a phosphinylamino group, a phosphono group, a silyl group, a hydrazino group, a ureido group, a borate group (—B(OH)$_2$), a phosfato group (—OPO(OH)$_2$), a sulfato group (—OSO$_3$H), and other known substituents.

The tin naphthalocyanine expressed by the above general formula (1) may be a commercially available product. Alternatively, the tin naphthalocyanine expressed by the above general formula (1) can be synthesized using a naphthalene derivative, which is expressed by the following general formula (2), as set forth in Japanese Unexamined Patent Application Publication No. 2010-232410, for example. $R^{25}$ to $R^{30}$ in the general formula (2) may be substituents similar to those used as $R^1$ to $R^{24}$ in the general formula (1).

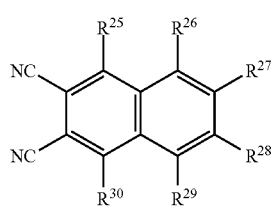

(2)

In the tin naphthalocyanine expressed by the above general formula (1), it is preferable, from the viewpoint of easiness in control of a molecular aggregation state, that eight or more among $R^1$ to $R^{24}$ are hydrogen atoms or deuterium atoms. More preferably, sixteen or more among $R^1$ to $R^{24}$ are hydrogen atoms or deuterium atoms. Even more preferably, all of $R^1$ to $R^{24}$ are hydrogen atoms or deuterium atoms. Additionally, tin naphthalocyanine expressed by the following general formula (3) is preferable from the viewpoint of easiness in synthesis.

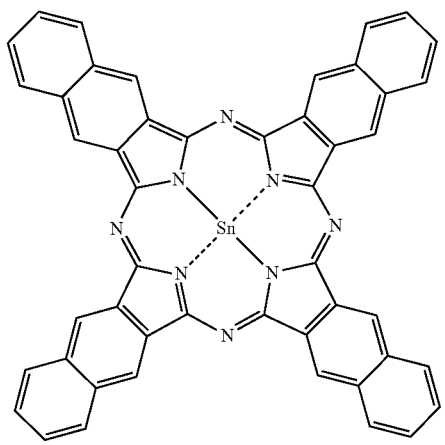

(3)

Figure 10:
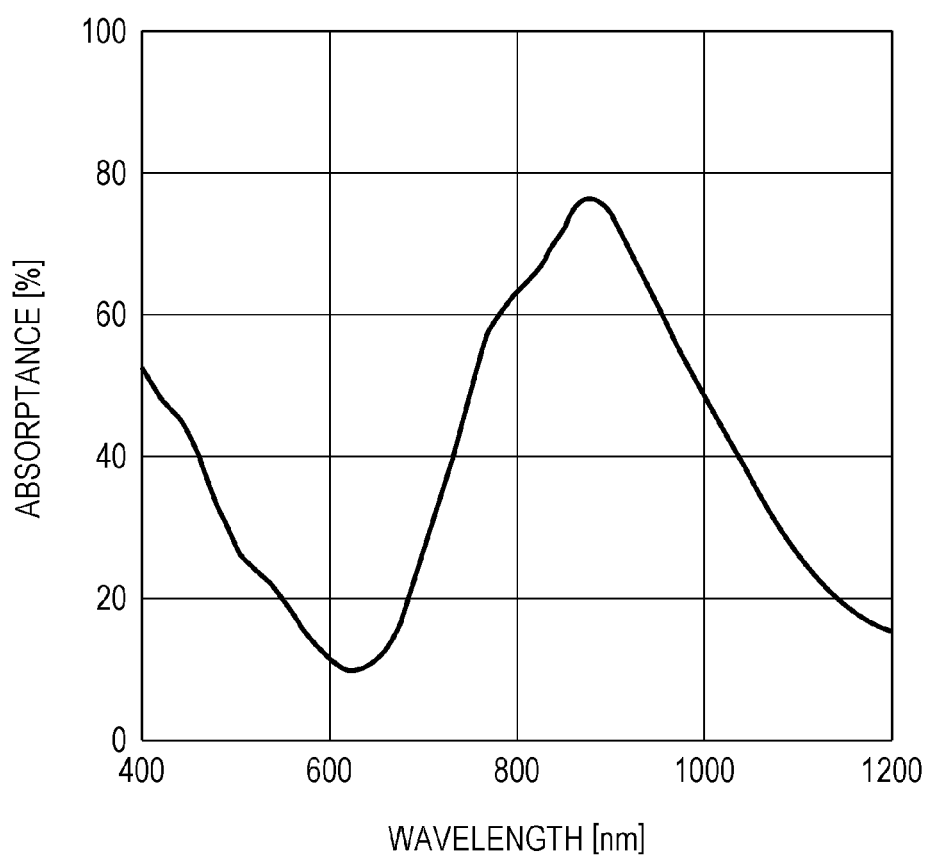
FIG. 10 is a graph depicting one example of an absorption spectrum in a photoelectric conversion layer that is formed of a material containing tin naphthalocyanine.

The tin naphthalocyanine expressed by the above general formula (1) exhibits absorption in a wavelength band from about 200 nm to about 1100 nm. The tin naphthalocyanine expressed by the above general formula (3), for example, has an absorption peak at the wavelength of about 870 nm as depicted in FIG. 10. FIG. 10 depicts one example of an absorption spectrum in a photoelectric conversion layer containing the tin naphthalocyanine expressed by the above general formula (3). A sample including the photoelectric conversion layer (thickness: 30 nm) laminated on a quartz substrate is used in measurement of the absorption spectrum.

As seen from FIG. 10, the photoelectric conversion layer formed of a material containing tin naphthalocyanine exhibits absorption in a near-infrared range. In other words, an imaging device capable of detecting near-infrared rays can be realized by selecting, as a material constituting the photoelectric conversion layers 12Ab and 12Bb, a material containing tin naphthalocyanine.

Figure 11:
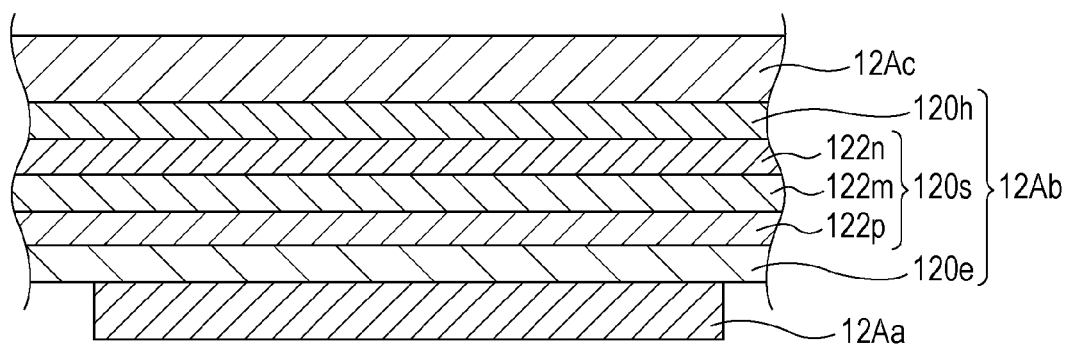
FIG. 11 is a schematic sectional view of a photoelectric conversion layer having a photoelectric conversion structure that is formed of an organic semiconductor material containing tin naphthalocyanine expressed by a general formula (1)

FIG. 11 schematically illustrates one example of configuration of the photoelectric conversion layer 12Ab. In the configuration illustrated in FIG. 11, the photoelectric conversion layer 12Ab includes a hole blocking layer 120h, a photoelectric conversion structure 120s formed of an organic semiconductor material containing the tin naphthalocyanine expressed by the above general formula (1), and an electron blocking layer 120e. The hole blocking layer 120h is disposed between the photoelectric conversion structure 120s and the transparent electrode 12Ac, and the electron blocking layer 120e is disposed between the photoelectric conversion structure 120s and the pixel electrode 12Aa. A configuration of the photoelectric conversion layer 12Bb may be the same as that of the photoelectric conversion layer 12Ab.

The photoelectric conversion structure 120s illustrated in FIG. 11 includes at least one of a p-type semiconductor and an n-type semiconductor. In the configuration illustrated in FIG. 11, the photoelectric conversion structure 120s includes a p-type semiconductor layer 122p, an n-type semiconductor layer 122n, and a mixed layer 122m sandwiched between the p-type semiconductor layer 122p and the n-type semiconductor layer 122n. The p-type semiconductor layer 122p is disposed between the electron blocking layer 120e and the mixed layer 122m, and it has the functions of photoelectric conversion and/or hole transport. The n-type semiconductor layer 122n is disposed between the hole blocking layer 120h and the mixed layer 122m, and it has the functions of photoelectric conversion and/or electron transport. As described later, the mixed layer 122m may include at least one of a p-type semiconductor and an n-type semiconductor.

The p-type semiconductor layer 122p includes an p-type organic semiconductor, and the n-type semiconductor layer 122n includes an n-type organic semiconductor. Stated in another way, the photoelectric conversion structure 120s includes an organic photoelectric conversion material containing the tin naphthalocyanine expressed by the above general formula (1), and at least one of an p-type organic semiconductor and an n-type organic semiconductor.

The p-type organic semiconductor (compound) implies a donor organic semiconductor (compound), i.e., an organic compound that has electron-donating properties, and that is mainly represented by a hole transport organic compound. More specifically, when two organic materials are used in a contact state, one of those two organic compounds, which exhibits a smaller ionization potential, is called the p-type organic semiconductor (compound). Thus, any type of organic compound can be used as the donor organic compound insofar as it is an organic compound with electron-donating properties. Examples of that type of organic compound include a triarylamine compound, a benzidine compound, a pyrazoline compound, a styryl amine compound, a hydrazone compound, a triphenylmethane compound, a carbazole compound, a polysilane compound, a thiophene compound such as P3HT, a phthalocyanine compound such as copper phthalocyanine, a cyanine compound, a merocyanine compound, an oxonol compound, a polyamine compound, an indole compound, a pyrrole compound, a pyrazole compound, a polyarylene compound, condensed aromatic carboncyclic compounds (such as a naphthalene derivative, an anthracene derivative, a phenanthrene derivative, a tetracene derivative, a pyrene derivative, a perylene derivative, and a fluoranthene derivative), and a metal complex having a nitrogen-containing heterocyclic compound as a ligand. The donor organic compound is not limited to the above-mentioned examples. As described above, the donor organic compound may be any type of organic compound having a smaller ionization potential than an organic compound used as the n-type (acceptor) compound. The above-mentioned tin naphthalocyanine is one example of the p-type organic semiconductor material.

The n-type organic semiconductor (compound) implies an acceptor organic semiconductor (compound), i.e., an organic compound that has electron-accepting properties, and that is mainly represented by an electron transport organic compound. More specifically, when two organic materials are used in a contact state, one of those two organic compounds, which exhibits a larger electron affinity, is called the n-type organic semiconductor (compound). Thus, any type of organic compound can be used as the acceptor organic compound insofar as it is an organic compound with electron-accepting properties. Examples of that type of organic compound include fullerene, fullerene derivatives such as phenyl $C_{61}$ butyric acid methyl ester (PCBM), condensed aromatic carboncyclic compounds (such as a naphthalene derivative, an anthracene derivative, a phenanthrene derivative, a tetracene derivative, a pyrene derivative, a perylene derivative, and a fluoranthene derivative), five- to seven-membered heterocyclic compounds containing a nitrogen atom, an oxygen atom, and a sulfur atom (such as pyridine, pyradine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), a polyarylene compound, a fluorene compound, a cyclopentadiene compound, a silyl compound, a perylenetetracarboxylic diimide compound (PTCDI), and a metal complex having a nitrogen-containing heterocyclic compound as a ligand. The acceptor organic semiconductor is not limited to the above-mentioned examples. As described above, the acceptor organic semiconductor may be any type of organic compound having a larger electron affinity than an organic compound used as the p-type (donor) organic compound.

The mixed layer 122m may be, for example, a bulk heterojunction structure layer including a p-type semiconductor and an n-type semiconductor. When the mixed layer 122m is formed as a layer having the bulk heterojunction structure, the tin naphthalocyanine expressed by the above general formula (1) can be used as the p-type semiconductor material. Fullerene and/or a fullerene derivative, for example, can be used as the n-type semiconductor material. It is preferable that the material constituting the p-type semiconductor layer 122p is the same as the p-type semiconductor material contained in the mixed layer 122m. Similarly, it is preferable that the material constituting the n-type semiconductor layer 122n is the same as the n-type semiconductor material contained in the mixed layer 122m. The bulk heterojunction structure is described in detail in Japanese Patent No. 5553727. For reference, the entire contents of Japanese Patent No. 5553727 are assumed to be incorporated in this specification.

The imaging device having sensitivity in the desired wavelength range can be realized by employing a proper material corresponding to a wavelength range to be detected. The photoelectric conversion layers 12Ab and 12Bb may include an inorganic semiconductor material, e.g., amorphous silicon. The photoelectric conversion layers 12Ab and 12Bb may include a layer made of an organic material and a layer made of an inorganic material. The following description is made in connection with an example in which the bulk heterojunction structure obtained by co-evaporation of the tin naphthalocyanine and $C_{60}$ is employed in the photoelectric conversion layers 12Ab and 12Bb. As described above, the configuration of the photoelectric conversion layer 12Bb may be the same as that of the photoelectric conversion layer 12Ab. In other words, the matters held for the photoelectric conversion layer 12Ab are similarly applied to the photoelectric conversion layer 12Bb. Therefore, description of the photoelectric conversion layer 12Bb is omitted below.

(Photocurrent Characteristics in Photoelectric Conversion Layer)

Figure 12:
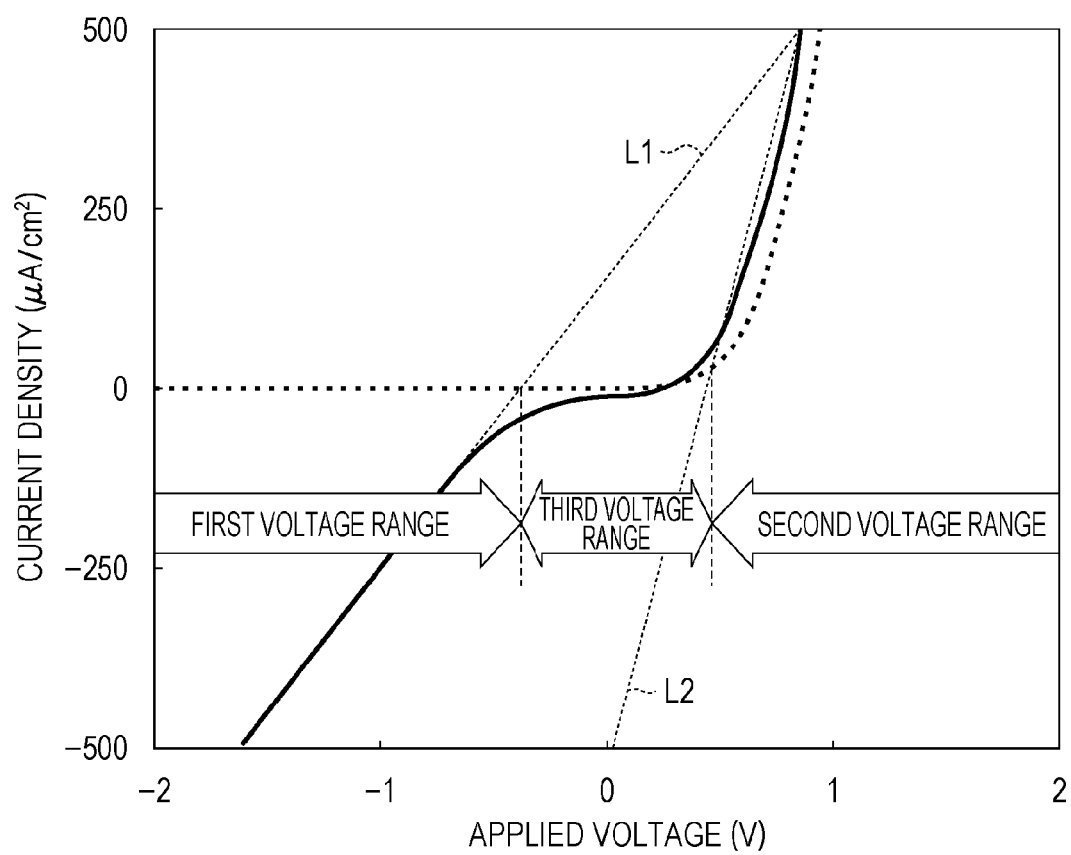
FIG. 12 is a graph depicting a typical example of photocurrent characteristics in the photoelectric conversion layer.

FIG. 12 depicts a typical example of photocurrent characteristics in the photoelectric conversion layer 12Ab. In a graph of FIG. 12, a thick solid-line curve denotes, by way of example, current-voltage characteristics (I-V characteristics) of the photoelectric conversion layer 12Ab in a state where the photoelectric conversion layer 12Ab is irradiated with light. One example of I-V characteristics in a state where the photoelectric conversion layer 12Ab is not irradiated with light is also depicted by a thick dotted-line curve in FIG. 12.

FIG. 12 depicts change in current density between two principal surfaces of the photoelectric conversion layer 12Ab when a bias voltage applied to those two principal surfaces is changed under constant illuminance. In this specification, a forward direction and a reverse direction of the bias voltage are defined as follows. When the photoelectric conversion layer has a junction structure made of a p-type semiconductor in the form of a layer and an n-type semiconductor in the form of a layer, a bias voltage providing a higher potential in the layer of the p-type semiconductor than in the layer of the n-type semiconductor is defined as the bias voltage in the forward direction. On the other hand, a bias voltage providing a lower potential in the layer of the p-type semiconductor than in the layer of the n-type semiconductor is defined as the bias voltage in the reverse direction. In the case of employing organic semiconductor materials, the forward direction and the reverse direction can be defined as in the case of employing inorganic semiconductor materials. When the photoelectric conversion layer has the bulk heterojunction structure, as schematically illustrated in FIG. 1 in the above-cited Japanese Patent No. 5553727, the p-type semiconductor appears in one of the two principal surfaces of the photoelectric conversion layer at a larger proportion than the n-type semiconductor, and the n-type semiconductor appears in the other principal surface of the photoelectric conversion layer at a larger proportion than the p-type semiconductor. Accordingly, a bias voltage providing a higher potential on the principal surface side where the p-type semiconductor appears at a larger proportion than on the principal surface side where the n-type semiconductor appears at a larger proportion than the p-type semiconductor is defined as the bias voltage in the forward direction.

As depicted in FIG. 12, the photocurrent characteristics in the photoelectric conversion layer 12Ab according to the embodiment of the present disclosure are roughly featured by three, i.e., first to third, voltage ranges. The first voltage range represents a reverse-bias voltage range where an absolute value of an output current density increases as the bias voltage in the reverse direction increases. Thus, the first voltage range may be called a voltage range where a photocurrent increases as the bias voltage applied between the principal surfaces of the photoelectric conversion layer increases. The second voltage range represents a forward-bias voltage range where the output current density increases as the bias voltage in the forward direction increases. Thus, the second voltage range is a voltage range where a current in the forward direction increases as the bias voltage applied between the principal surfaces of the photoelectric conversion layer increases. The third voltage range is a voltage range between the first voltage range and the second voltage range.

The first to third voltage ranges can be discriminated in accordance with a gradient of the graph representing the photocurrent characteristics when the vertical axis and the horizontal axis are each expressed in a linear scale. For reference, in FIG. 12, an average gradient of the graph in the first voltage range is denoted by a dotted line L1, and an average gradient of the graph in the second voltage range is denoted by a dotted line L2. As depicted in FIG. 12, by way of example, a change rate of the output current density relative to an increase of the bias voltage is different among the first voltage range, the second voltage range, and the third voltage range. The third voltage range is defined as a voltage range where the change rate of the output current density relative to the bias voltage is smaller than the respective change rates in the first voltage range and the second voltage range. Alternatively, the third voltage range may be determined on the basis of a position of rising (falling) in the graph that represents the I-V characteristics. Typically, the third voltage range is larger than −1 V and smaller than +1 V. In the third voltage range, the current density between the principal surfaces of the photoelectric conversion layer is hardly changed even when the bias voltage is changed. As depicted in FIG. 12, by way of example, the absolute value of the current density in the third voltage range is typically not more than 100 μA/cm$^2$.

In the third voltage range, as described later in detail, the hole-electron pairs generated with the irradiation of the light promptly recombine and disappear upon stop of the light irradiation. Therefore, a high-speed response can be realized by adjusting the bias voltage, which is applied between the two principal surfaces of the photoelectric conversion layer 12Ab during the operation of the imaging device 100, to the voltage within the third voltage range. Because, in the third voltage range, the hole-electron pairs generated with the irradiation of the light promptly recombine and disappear upon stop of the light irradiation, the output of the pixel cell 10A exhibits a variation corresponding to change in the illuminance at the time of the light irradiation without depending on an integrated amount of the light. Thus, when the potential difference applied between the two principal surfaces of the photoelectric conversion layer 12Ab is set to a difference corresponding to the voltage within the third voltage range, timing of exposure and timing of reading a signal are basically coincident with each other.

Referring to FIGS. 1 and 2 again, in the typical embodiment of the present disclosure, the detection of the light is performed in a state where a potential difference between one of the two impurity regions of the signal detection transistor 14A, the one being connected to the first voltage line 51, and the transparent electrode 12Ac is maintained within the above-mentioned third voltage range during the operation of the imaging device 100. In the configuration described with reference to FIGS. 1 and 2, by way of example, the bias voltage falling within the third voltage range with the impurity region 22ad being a reference is supplied to the transparent electrode 12Ac from the voltage supply circuit 50. In an operation of detecting the light, therefore, the photoelectric conversion layer 12Ab is in a state where the bias voltage within the third voltage range is applied between the principal surface of the photoelectric conversion layer 12Ab on the side close to the pixel electrode 12Aa and the principal surface thereof on the side close to the transparent electrode 12Ac. Similarly, in the pixel cell 10B, the potential difference between one of the two impurity regions of the signal detection transistor 14B, the one being connected to the first voltage line 51, and the transparent electrode 12Bc is maintained within the third voltage range in the operation of detecting the light.

With incidence of the light upon the photoelectric conversion layer 12Ab, hole-electron pairs are generated inside the photoelectric conversion layer 12Ab. At that time, because the predetermined bias voltage is applied to the photoelectric conversion layer 12Ab, respective dipole moments of the hole-electron pairs are oriented almost uniformly in the same direction. Therefore, the dielectric constant of the photoelectric conversion layer 12Ab increases with the generation of the hole-electron pairs. On an assumption that E denotes the magnitude of an electric field in the state where the photoelectric conversion layer 12Ab is applied with the predetermined bias voltage and is irradiated with the light, $E=((\sigma_f-\sigma_p)/\epsilon_0)$ and $E=(\sigma_f/\epsilon)$ are held on the basis of Gauss's law. Here, $\sigma_f$ denotes a charge density in an electrode (e.g., the transparent electrode 12Ac), and $\sigma_p$ denotes a density of charges generated due to polarization in a surface of the photoelectric conversion layer 12Ab, the surface being opposed to the electrode. Furthermore, $\epsilon_0$ denotes the dielectric constant of vacuum, and $\epsilon$ denotes the dielectric constant of the photoelectric conversion layer 12Ab. From $E=((\sigma_f-\sigma_p)/\epsilon_0)$ and $E=(\sigma_f/\epsilon)$, $\epsilon=\epsilon_0(\sigma_f/(\sigma_f-\sigma_p))$ is obtained. Thus, it is understood that the dielectric constant of the photoelectric conversion layer 12Ab increases with an increase of charges (hole-electron pairs) that contribute to the polarization. In other words, the dielectric constant between the pixel electrode 12Aa and the transparent electrode 12Ac increases with the irradiation of the light to the photoelectric conversion layer 12Ab.

Assuming here a set of the photoelectric converter 12A and the signal detection transistor 14A to be one field effect transistor, with an increase of the dielectric constant between the pixel electrode 12Aa and the transparent electrode 12Ac, the field effect transistor comes into a state analogous to the state where a threshold voltage in the field effect transistor is reduced (namely, an effective gate voltage in the field effect transistor is increased). Thus, a voltage of the impurity region 22as is changed due to change in the dielectric constant between the pixel electrode 12Aa and the transparent electrode 12Ac with a source follower configuration. Stated in another way, a source voltage of the signal detection transistor 14A is changed depending on change in the illuminance applied to the pixel cell 10A. Accordingly, the light can be detected by detecting change in the source voltage with an appropriate detection circuit.

A point to be noted here is that the bias voltage within the third voltage range is applied to the photoelectric conversion layers 12Ab and 12Bb during the detection of the light. In a related-art photosensor utilizing a photodiode (or a photoelectric conversion film), an operation of detecting light is generally performed under condition of a reverse bias, which corresponds to the first voltage range illustrated in FIG. 12. Therefore, holes generated with the photoelectric conversion drift toward a cathode of the photodiode, and electrons generated with the photoelectric conversion drift toward an anode of the photodiode. Thus, in the detection of the light by the related-art photosensor utilizing the photodiode (or the photoelectric conversion film), charges generated with the photoelectric conversion are taken out as a signal to an external circuit.

On the other hand, in the imaging device 100 according to the present disclosure, the bias voltage within the third voltage range is typically applied to the photoelectric conversion layers 12Ab and 12Bb during the detection of the light. When the photoelectric conversion layers 12Ab and 12Bb are irradiated with the light in the state where the bias voltage within the third voltage range is applied, hole-electron pairs are generated in the photoelectric conversion layers 12Ab and 12Bb. In the state where the bias voltage within the third voltage range is applied, the generated holes and electrons form dipoles without drifting to the electrodes separately. In other words, the generated holes and electrons are not taken out to the outside of the photoelectric conversion layers 12Ab and 12Bb.

Respective speeds of outflow of charges from the photoelectric conversion layer and inflow of charges into the photoelectric conversion layer are slow (about several tens milliseconds). Accordingly, when the configuration accompanying with the outflow of charges from the photoelectric conversion layer or the inflow of charges into the photoelectric conversion layer is applied to an image sensor, there is a possibility of causing noise, a residual image, etc. with application of the voltage to the photoelectric conversion layers, the irradiation of the light at the start of image-taking, etc. On the other hand, in the typical configuration according to the present disclosure, the bias voltage applied to the photoelectric conversion layers 12Ab and 12Bb during the detection of the light is set to the voltage within the third voltage range. Thus, the occurrence of noise, a residual image, etc. can be suppressed because of not accompanying with the outflow of charges from the photoelectric conversion layer and the inflow of charges into the photoelectric conversion layer.

Furthermore, in the state where the bias voltage within the third voltage range is applied, the hole-electron pairs recombine and disappear promptly (not longer than several tens microseconds) when the incidence of the light upon the photoelectric conversion layers 12Ab and 12Bb is stopped. Hence a high-speed response can be realized with the typical embodiment of the present disclosure. Since the high-speed response is realized, the imaging device 100 according to the embodiment of the present disclosure can be advantageously applied to distance measurement with the use of the time-of-flight method, ultra-high-speed image taking, etc.

In addition, while only ones of the holes and the electrons can be utilized as signal charges in a layered image sensor, the holes and the electrons are utilized in pairs to cause change in the source voltage in the imaging device 100 according to the embodiment of the present disclosure. Hence higher sensitivity can be realized. Furthermore, since the potential difference applied between the two principal surfaces of each of the photoelectric conversion layers 12Ab and 12Bb is set to a value corresponding to the third voltage range, the generated pairs of holes and electrons promptly recombine when the irradiation of the light is stopped. Thus, unlike the multilayered image sensor, an operation of resetting the potential of the pixel electrode is basically not required. The imaging device 100 according to the embodiment of the present disclosure does not perform an operation of accumulating the holes or the electrons, which are generated in the photoelectric conversion layers 12Ab and 12Bb, as signal charges in a floating diffusion. For that reason, the semiconductor substrate 22 does not have a charge accumulation region to accumulate the signal charges, unlike the multilayered image sensor.

(Modification)

In the case of utilizing the above-mentioned third voltage range, the voltage applied between the two principal surfaces of the photoelectric conversion layers 12Ab and between the two principal surfaces of the photoelectric conversion layers 12Bb during the detection of the light is comparatively small, e.g., about 0.1 V. This is advantageous in that a material having a narrow band gap can be more easily used as the materials of the photoelectric conversion layers 12Ab and 12Bb. Moreover, in the case of utilizing the third voltage range, the potential difference applied between the impurity region 22ad and the transparent electrode 12Ac and the potential difference applied between the impurity region 22bd and the transparent electrode 12Bc are comparatively small. Accordingly, a comparatively thin insulating film can be used as each of the gate insulating layers 14Ag and 14Bg, and information regarding the illuminance is easier to obtain in the form of change in the source voltage. However, as described later, it is also possible to perform the detection of the light by applying the bias voltage within the first voltage range to each of the photoelectric conversion layers 12Ab and 12Bb.

Figure 13:
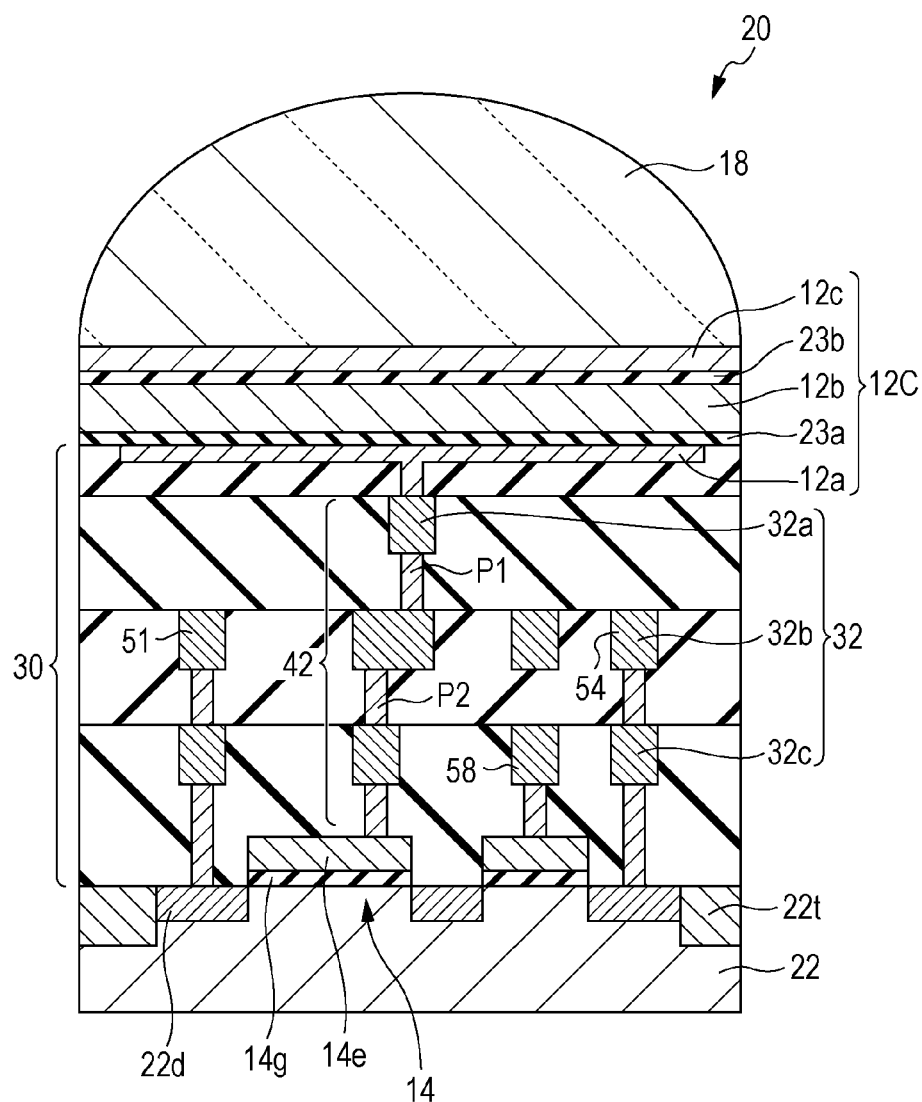
FIG. 13 is a schematic sectional view illustrating a modification of the pixel cell in the imaging device.

FIG. 13 illustrates a modification of the pixel cell in the imaging device 100. A pixel cell 20, illustrated in FIG. 13, is different from the pixel cells 10A and 10B, illustrated in FIGS. 6 and 7, in that a photoelectric converter 12C of the pixel cell 20 includes an insulating layer between the photoelectric conversion layer 12b and an electrode or each of electrodes (here a pixel electrode 12a and/or a transparent electrode 12c). In an exemplary configuration illustrated in FIG. 13, an insulating layer 23a is disposed between the pixel electrode 12a and a photoelectric conversion layer 12b, and an insulating layer 23b is disposed between the photoelectric conversion layer 12b and the transparent electrode 12c. The pixel cell 20 may be used instead of at least one of the pixel cells 10A and 10B.

For example, a material exhibiting a smaller leak current than a material constituting the photoelectric conversion layer 12b can be selected to constitute the insulating layers 23a and 23b. A silicon oxide film having a thickness of 5.4 nm, for example, can be used as each of the insulating layers 23a and 23b. The silicon oxide film can be formed by, e.g., CVD.

According to the configuration illustrated in FIG. 13, since the insulating layer 23a is disposed between the pixel electrode 12a and the photoelectric conversion layer 12b and the insulating layer 23b is disposed between the photoelectric conversion layer 12b and the transparent electrode 12c, a larger bias voltage can be applied between the drain region (or the source region) of the signal detection transistor 14 and the transparent electrode 12c. For example, a voltage of 1.2 V can be applied as the first bias voltage to an impurity region 22d, and a voltage of 3.7 V can be applied as the second bias voltage to the transparent electrode 12c. Thus, in this modification, a potential difference of about 2.5 V can be applied between the impurity region 22d and the transparent electrode 12c.

In the configuration illustrated in FIG. 13, the pixel electrode 12a and a gate electrode 14e of the signal detection transistor 14 are electrically connected to each other through a connecting portion 42. In the illustrated example, because the gate insulating layer 14g of the signal detection transistor 14 and the insulating layers 23a and 23b each constitute a capacitor, a voltage applied between the impurity region 22d, which serves as the drain region of the signal detection transistor 14, and the transparent electrode 12c is divided among the gate insulating layer 14g, the insulating layer 23a, the insulating layer 23b, and the photoelectric conversion layer 12b. Accordingly, a voltage actually applied to each of the gate insulating layer 14g and the insulating layers 23a and 23b is about 0.8 V. When the thickness of the silicon oxide film is not less than 5.4 nm, a leak current in the silicon oxide film is sufficiently low even with the applied voltage being about 2.5 V. Thus, satisfactory characteristics during non-irradiation of light can be sufficiently ensured even when the potential difference of about 2.5 V is applied between the impurity region 22d and the transparent electrode 12c.

As described above, with the provision of the insulating layers (i.e., the insulating layers 23a and 23b in the illustrated modification) between the photoelectric conversion layer 12b and the electrodes, a larger bias voltage can be applied between the drain region (or the source region) of the signal detection transistor 14 and the transparent electrode 12c. For example, the bias voltage causing the potential difference, which is applied between the two principal surfaces of the photoelectric conversion layer 12b, to fall within the above-mentioned first voltage range may be applied between the drain region (or the source region) of the signal detection transistor 14 and the transparent electrode 12c.

When the photoelectric conversion layer 12b is irradiated with the light in the state where the bias voltage within the first voltage range (see FIG. 12) is applied to the photoelectric conversion layer 12b, ones of holes and electrons generated with photoelectric conversion drift toward the transparent electrode 12c, and the others drift toward the pixel electrode 12a. Thus, in the case of applying the bias voltage within the first voltage range to the photoelectric conversion layer 12b, because positive charges and negative charges generated with the photoelectric conversion are separated, a time until pairs of the holes and the electrons recombine after stopping the irradiation of the light is longer than that in the case of applying the bias voltage within the third voltage range to the photoelectric conversion layer 12b. Accordingly, the timing of exposure and the timing of reading a signal are not always required to be coincident with each other. Since the timing of exposure and the timing of reading a signal can be made different from each other in a comparatively easy manner, applying the bias voltage within the first voltage range to the photoelectric conversion layer 12b is advantageous from one point of view when the embodiment of the present disclosure is applied to an image sensor.

In the state where the bias voltage within the first voltage range is applied to the photoelectric conversion layer 12b, the insulating layer 23a between the photoelectric conversion layer 12b and the pixel electrode 12a is able to function as a capacitor that accumulates ones of the holes and the electrons generated with the photoelectric conversion. Corresponding to the accumulation of charges in that capacitor, electrostatic induction occurs in the connecting portion 42 interconnecting the pixel electrode 12a and the gate electrode 14e, whereby an effective gate voltage at the signal detection transistor 14 is changed. In other words, a threshold voltage of the signal detection transistor 14 is changed. After the end of reading of the output signal, a reset operation of resetting the charges accumulated in the insulating layer 23a, which serves as a capacitor, is executed, for example, by applying a voltage having a polarity reversed to that of the second bias voltage to the transparent electrode 12c. As a matter of course, the operation of detecting the light may be performed in the state where the bias voltage within the above-mentioned third voltage range is applied to the photoelectric conversion layer 12b. In that case, the reset operation is not needed.

Even when the potential difference between the impurity region 22d and the transparent electrode 12c is increased by arranging the insulating layer in at least one of interfaces between the photoelectric conversion layer 12b and the pixel electrode 12a and between the photoelectric conversion layer 12b and the transparent electrode 12c, the charges generated with the photoelectric conversion can be suppressed from drifting to the outside of the photoelectric conversion layer 12b. Hence the occurrence of a residual image can be suppressed. Instead of the silicon oxide film, a silicon nitride film, an aluminum oxide film, a High-k film (e.g., $HfO_2$ film), or the like may be used as the insulating layer 23a and/or the insulating layer 23b.

The above embodiments have been described in connection with the example in which the signal detection transistors 14, 14A and 14B and the address transistors 16A and 16B are each an N-channel MOS, for example. However, the transistors used in embodiments of the present disclosure are not limited to the N-channel MOSs. The signal detection transistors 14, 14A and 14B and the address transistors 16A and 16B may be each a P-channel MOS. In addition, it is not always required that those transistors are all the N-channel MOSs or the P-channel MOSs. Other than FETs, bipolar transistors can also be used as the address transistors 16A and 16B.

The pixel array PA in the imaging device 100 can be manufactured by employing general semiconductor manufacturing processes. In particular, when a silicon substrate is used as the semiconductor substrate 22, the imaging device 100 can be manufactured by utilizing various silicon semiconductor processes.

(Camera System)

Figure 14:
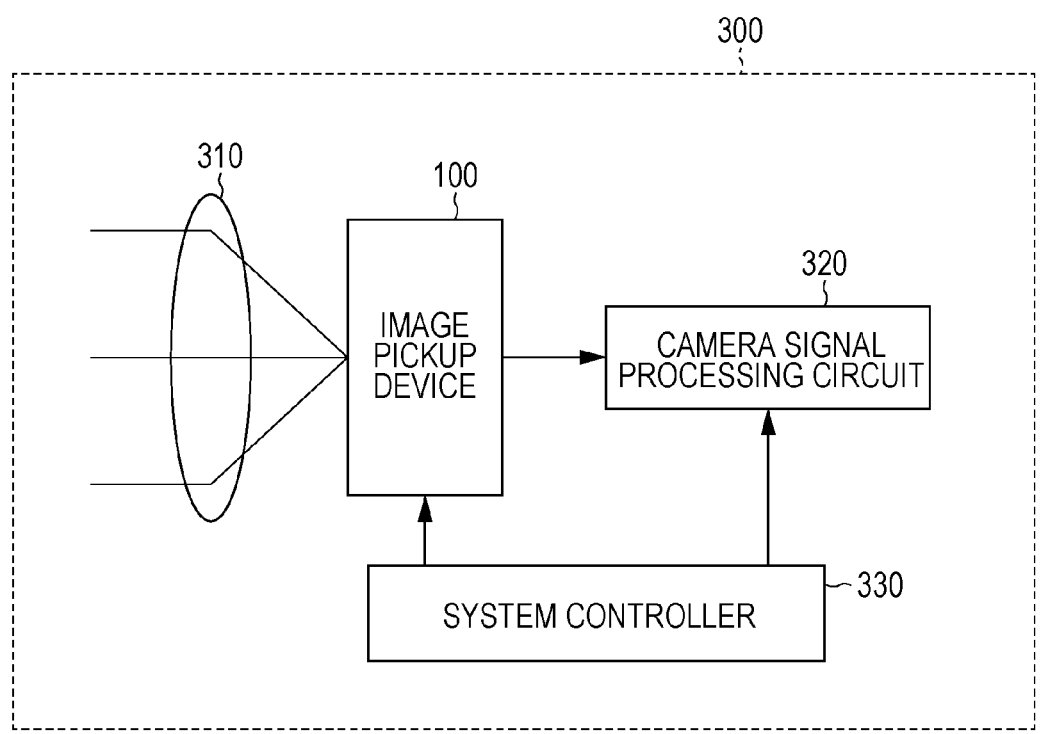
FIG. 14 is a block diagram illustrating an exemplary configuration of a camera system.

FIG. 14 schematically illustrates an exemplary configuration of a camera system. A camera system 300 illustrated in FIG. 14 includes a lens optical system 310, the above-described imaging device 100, a system controller 330, and a camera signal processing circuit 320. The camera system 300 may have an input interface, including various buttons, a touch screen, etc., to accept an input from a user.

The lens optical system 310 includes, for example, an autofocusing lens, a zooming lens, and a diaphragm. The lens optical system 310 condenses light onto an imaging surface of the imaging device 100. When the photoelectric conversion layers 12Ab and 12Bb are each formed by employing a material that exhibits absorption in a wavelength range of visible light, a color filter may be disposed on the imaging surface of the imaging device 100.

The system controller 330 controls the entirety of the camera system 300. The system controller 330 may be implemented with, e.g., a microcontroller. The system controller 330 may include one or more memories. The system controller 330 controls respective operations in, e.g., the vertical scanning circuit 60, the voltage supply circuit 50, and so on.

The camera signal processing circuit 320 functions as a signal processing circuit that processes the output signal from the imaging device 100. The camera signal processing circuit 320 executes processes such as gamma correction, a color interpolation process, a spatial interpolation process, and auto white balance. The camera signal processing circuit 320 may execute, for example, high dynamic range imaging on the basis of an output of the imaging device 100. Image data on the basis of an output of the pixel cell 10A and image data on the basis of an output of the pixel cell 10B may be produced in a process of the high dynamic range imaging. The camera signal processing circuit 320 may be implemented with, e.g., a DSP (digital signal processor), an ISP (image signal processor), or a FPGA (field-programmable gate array). The camera signal processing circuit 320 may include one or more memories.

The camera signal processing circuit 320 is not always required to be a processing circuit dedicated for the high dynamic range imaging. The high dynamic range imaging may be implemented with a combination of a general purpose processing circuit and a program that describes necessary processing. Such a program may be stored in a memory inside the camera signal processing circuit 320 or a memory in the system controller 330.

At least one of the system controller 330 and the camera signal processing circuit 320 may be formed on the semiconductor substrate 22 on which the pixel cells 10A and 10B are formed. A size of the camera system 300 can be reduced by manufacturing not only at least one of the system controller 330 and the camera signal processing circuit 320, but also the imaging device 100 as a single semiconductor device.

The imaging device according to the present disclosure can be applied to an optical detector, an image sensor, etc. The imaging device can take an image with the use of infrared rays by appropriately selecting the material of the photoelectric conversion layer. The imaging device taking an image with the use of infrared rays can be applied to, e.g., a security camera or a camera mounted on a vehicle, etc. The vehicle-mounted camera may be utilized to provide an input for a controller in order to ensure, e.g., safe running of the vehicle. Alternatively, the vehicle-mounted camera may be utilized to assist an operator for the purpose of safe running of the vehicle.

What is claimed is:

1. An imaging device comprising:
    a first pixel cell comprising:
        a first photoelectric converter including a first electrode, a second electrode facing the first electrode, and a first photoelectric conversion layer between the first electrode and the second electrode;
        a first field effect transistor having a first gate and a first channel region, the first gate being connected to the first electrode; and
        a first node between the first photoelectric converter and the first field effect transistor, and
    a second pixel cell comprising:
        a second photoelectric converter including a third electrode, a fourth electrode facing the third electrode, and a second photoelectric conversion layer between the third electrode and the fourth electrode;
        a second field effect transistor having a second gate and a second channel region, the second gate being connected to the third electrode, and
        a second node between the first photoelectric converter and the second field effect transistor, wherein
    the first field effect transistor outputs a first electric signal corresponding to change in dielectric constant between the first electrode and the second electrode, the change being caused by incident light on the first photoelectric conversion layer,
    the second field effect transistor outputs a second electric signal corresponding to change in dielectric constant between the third electrode and the fourth electrode, the change being caused by incident light on the second photoelectric conversion layer, and
    Cpd1, Cn1, Cpd2 and Cn2 satisfy a relation of Cpd1/Cn1<Cpd2/Cn2 where a value of capacitance of the first photoelectric converter in a state of receiving no incident light is represented as Cpd1, a value of capacitance between the first node and the first channel region is represented as Cn1, a value of capacitance of the second photoelectric converter in a state of receiving no incident light is represented as Cpd2, and a value of capacitance between the second node and the second channel region is represented as Cn2.

2. The imaging device according to claim 1, wherein the first photoelectric conversion layer and the second photoelectric conversion layer are a single continuous layer.

3. The imaging device according to claim 1, wherein the second electrode and the fourth electrode are a single continuous electrode.

4. The imaging device according to claim 1, comprising a plurality of pixel cells including the first pixel cell and the second pixel cell, wherein the plurality of pixel cells are arranged one-dimensionally or two-dimensionally.

5. The imaging device according to claim 1, wherein the first pixel cell is directly adjacent to the second pixel cell.

6. The imaging device according to claim 1, wherein
    the capacitance between the first node and the first channel region includes a capacitance of a first gate insulating layer of the first field effect transistor, and
    the capacitance between the second node and the second channel region includes a capacitance of a second gate insulating layer of the second field effect transistor.

7. The imaging device according to claim 1, wherein
    each of the first photoelectric conversion layer and the second photoelectric conversion layer has a photocurrent characteristic between a bias voltage and an output current density, the photocurrent characteristic including a first voltage range where an absolute value of the output current density increases as the bias voltage increases in a reverse direction, a second voltage range where the output current density increases as the bias voltage increases in a forward direction, and a third voltage range where an absolute value of a change rate of the output current density relative to the bias voltage is smaller than in the first voltage range and the second voltage range, the third voltage range being a voltage range between the first voltage range and the second voltage range.

8. The imaging device according to claim 7, further comprising
    a first voltage supply circuit that supplies a first bias voltage within the third voltage range to the first photoelectric conversion layer, and
    a second voltage supply circuit that supplies a second bias voltage within the third voltage range to the second photoelectric conversion layer.

9. The imaging device according to claim 7, further comprising
    a first controller that causes the first voltage supply circuit to supply the first bias voltage, and a second controller that causes the second voltage supply circuit to supply the second bias voltage.

10. The imaging device according to claim 7, wherein the first bias voltage is equal to the second bias voltage.

11. The imaging device according to claim 1, wherein, in a plan view, an area of the first electrode is smaller than an area of the third electrode.

12. The imaging device according to claim 1, wherein, in a plan view, an area of a gate insulating layer of the first field effect transistor is larger than an area of a gate insulating layer of the second field effect transistor.

13. The imaging device according to claim 1, wherein a thickness of a gate insulating layer of the first field effect transistor is smaller than a thickness of a gate insulating layer of the second field effect transistor.

14. The imaging device according to claim 1, wherein the first pixel cell includes a microlens located on the second electrode.

* * * * *